United States Patent
Chistyakov et al.

(10) Patent No.: US 10,480,063 B2
(45) Date of Patent: *Nov. 19, 2019

(54) CAPACITIVE COUPLED PLASMA SOURCE FOR SPUTTERING AND RESPUTTERING

(71) Applicant: IonQuest LLC, Mansfield, MA (US)

(72) Inventors: Roman Chistyakov, North Andover, MA (US); Bassam Hanna Abraham, Millis, MA (US)

(73) Assignee: IonQuest Corp., Mansfield, MA (US)

( * ) Notice: Subject to any disclaimer, the term of this patent is extended or adjusted under 35 U.S.C. 154(b) by 272 days.

This patent is subject to a terminal disclaimer.

(21) Appl. No.: 15/260,841

(22) Filed: Sep. 9, 2016

(65) Prior Publication Data
US 2017/0178912 A1    Jun. 22, 2017

Related U.S. Application Data

(60) Provisional application No. 62/270,356, filed on Dec. 21, 2015.

(51) Int. Cl.
   *C23C 14/04* (2006.01)
   *C23C 14/35* (2006.01)
   (Continued)

(52) U.S. Cl.
   CPC ........ *C23C 14/354* (2013.01); *C23C 14/0057* (2013.01); *C23C 14/0605* (2013.01);
   (Continued)

(58) Field of Classification Search
   CPC .. C23C 14/354; C23C 14/345; H01J 37/3426; H01J 37/3464; H01J 37/345
   See application file for complete search history.

(56) References Cited

U.S. PATENT DOCUMENTS

| | | |
|---|---|---|
| 3,767,551 A | 10/1973 | Lang, Jr. et al. |
| 4,588,490 A | 5/1986 | Cuomo et al. |

(Continued)

FOREIGN PATENT DOCUMENTS

| | | |
|---|---|---|
| WO | 2014/053209 A1 | 4/2014 |
| WO | 2016/028640 A1 | 2/2016 |

(Continued)

OTHER PUBLICATIONS

Non-Final Office Action received for U.S. Appl. No. 15/260,857 dated Mar. 9, 2018, 38 pages.

(Continued)

*Primary Examiner* — Jason Berman
(74) *Attorney, Agent, or Firm* — FisherBroyles, LLP

(57) ABSTRACT

An ionized physical vapor deposition (I-PVD) source includes an electrically and magnetically enhanced radio frequency (RF) diode, which has magnetic field lines directed substantially perpendicular to a cathode that terminate on an electrode positioned between an anode around the cathode. The anode forms a gap and the electrode is positioned behind the gap. An RF power supply connected to the cathode generates RF discharge. The cathode is inductively grounded to prevent forming a constant voltage bias during RF discharge. The electrons drift between the cathode and the gap, thereby producing ionization and forming high density plasma. The electrons drift and energy are controlled by applying different voltage potentials to the electrode. The I-PVD source is positioned in a vacuum chamber to form an I-PVD apparatus that generates ions from sputtered target material atoms and deposition. During sputtering, the substrate is biased. The I-PVD source performs chemically enhanced ionized physical vapor deposition (CE-IPVD).

20 Claims, 16 Drawing Sheets

(51) Int. Cl.

| | |
|---|---|
| *C23C 14/34* | (2006.01) |
| *H01J 37/34* | (2006.01) |
| *H01L 21/285* | (2006.01) |
| *H01L 21/768* | (2006.01) |
| *H01L 23/522* | (2006.01) |
| *H01L 23/532* | (2006.01) |
| *H01J 37/32* | (2006.01) |
| *C23C 14/00* | (2006.01) |
| *C23C 14/06* | (2006.01) |
| *C23C 14/14* | (2006.01) |

(52) U.S. Cl.
CPC ............ *C23C 14/14* (2013.01); *C23C 14/345* (2013.01); *C23C 14/3485* (2013.01); *C23C 14/35* (2013.01); *H01J 37/321* (2013.01); *H01J 37/32825* (2013.01); *H01J 37/345* (2013.01); *H01J 37/3405* (2013.01); *H01J 37/3417* (2013.01); *H01J 37/3426* (2013.01); *H01J 37/3435* (2013.01); *H01J 37/3452* (2013.01); *H01J 37/3455* (2013.01); *H01J 37/3464* (2013.01); *H01J 37/3467* (2013.01); *H01L 21/2855* (2013.01); *H01L 21/76843* (2013.01); *H01L 21/76871* (2013.01); *H01L 21/76879* (2013.01); *H01L 21/76882* (2013.01); *H01L 23/5226* (2013.01); *H01L 23/53238* (2013.01)

(56) References Cited

U.S. PATENT DOCUMENTS

| | | | |
|---|---|---|---|
| 5,178,739 | A | 1/1993 | Barnes et al. |
| 5,227,211 | A | 7/1993 | Eltoukhy et al. |
| 5,482,611 | A | 1/1996 | Helmer et al. |
| 5,651,865 | A | 7/1997 | Sellers |
| 6,024,843 | A | 2/2000 | Anderson et al. |
| 6,216,632 | B1 | 4/2001 | Wickramanayaka |
| 6,903,511 | B2 | 6/2005 | Chistyakov |
| 7,327,089 | B2 | 2/2008 | Madocks |
| 9,624,571 | B2 | 4/2017 | Arndt et al. |
| 9,951,414 | B2 * | 4/2018 | Chistyakov ........... C23C 14/345 |
| 10,227,691 | B2 | 3/2019 | Abraham et al. |
| 10,227,692 | B2 | 3/2019 | Chistyakov et al. |
| 2004/0095497 | A1 | 5/2004 | Compton et al. |
| 2004/0227470 | A1 | 11/2004 | Benveniste et al. |
| 2006/0290399 | A1 | 12/2006 | MacDougall et al. |
| 2008/0190760 | A1 | 8/2008 | Tang et al. |
| 2009/0321249 | A1 | 12/2009 | Chistyakov et al. |
| 2011/0011737 | A1 | 1/2011 | Wu et al. |
| 2014/0041800 | A1 | 2/2014 | Okuyama et al. |
| 2015/0348773 | A1 | 12/2015 | Zhu et al. |
| 2017/0178878 | A1 | 6/2017 | Abraham et al. |
| 2018/0374688 | A1 | 12/2018 | Chistyakov et al. |
| 2018/0374689 | A1 | 12/2018 | Abraham et al. |

FOREIGN PATENT DOCUMENTS

| | | |
|---|---|---|
| WO | 2017/112696 A1 | 6/2017 |
| WO | 2017/112700 A1 | 6/2017 |
| WO | 2018/186901 A1 | 10/2018 |

OTHER PUBLICATIONS

Final Office Action received for U.S. Appl. No. 15/260,857 dated Nov. 19, 2018, 16 pages.

Helmersson et al., "Ionized physical vapor deposition (IPVD): A review of technology and applications", URL: http://run.kb.se/resolve?urn=urn:nbn:se:liu:diva-10434, Postprint available: Linkoping University E-Press, Article in Thin Solid Films, Aug. 14, 2006, 61 pages.

International Search Report and Written Opinion received for PCT Application Serial No. PCT/US2017/048438 Nov. 3, 2017, 10 pages.

Non-Final Office Action received for U.S. Appl. No. 15/261,119 dated Jun. 26, 2017, 14 pages.

Final Office Action received for U.S. Appl. No. 15/261,119 dated Oct. 30, 2017, 11 pages.

Notice of Allowance received for U.S. Appl. No. 15/261,119 dated Jan. 26, 2018, 14 pages.

Non-Final Office Action received for U.S. Appl. No. 15/917,046 dated Jun. 22, 2018, 17 pages.

Notice of Allowance received for U.S. Appl. No. 15/917,046 dated Oct. 29, 2018, 19 pages.

Non-Final Office Action received for U.S. Appl. No. 15/261,197 dated Jun. 18, 2018, 14 pages.

Notice of Allowance received for U.S. Appl. No. 15/261,197 dated Oct. 31, 2018, 18 pages.

International Search Report and Written Opinion received for PCT Application Serial No. PCT/US2016/067850 dated Mar. 9, 2017, 7 pages.

International Preliminary Report on Patentability received for PCT Application Serial No. PCT/US2016/067850 dated Jul. 5, 2018, 7 pages.

Wang et al., "Hollow cathode magnetron", Journal of Vacuum Science & Technology A, vol. 17, No. 1, 1999, pp. 77-82.

International Search Report and Written Opinion received for PCT Application Serial No. PCT/US2016/067838 dated Mar. 16, 2017, 7 pages.

International Preliminary Report on Patentability received for PCT Application Serial No. PCT/US2016/067838 dated Jul. 5, 2018, 6 pages.

Abraham et al., "Electrically and Magnetically Enhanced Ionized Physical Vapor Deposition Unbalanced Sputtering Source", U.S. Appl. No. 16/284,327 dated Feb. 25, 2019, 114 pages.

Abraham et al., "Electrically and Magnetically Enhanced Ionized Physical Vapor Deposition Unbalanced Sputtering Source", U.S. Appl. No. 16/400,539 dated May 1, 2019, 64 pages.

Chistyakov et al., "Magnetically Enhanced High Density Plasma-Chemical Vapor Deposition Plasma Source for Depositing Diamond and Diamond-Like Films", U.S. Appl. No. 16/261,514 dated Jan. 29, 2019, 62 pages.

Abraham et al., "Magnetically Enhanced Low Temperature-High Density Plasma-Chemical Vapor Deposition Plasma Source for Depositing Diamond and Diamond Like Films", U.S. Appl. No. 16/261,516 dated Jan. 29, 2019, 60 pages.

Abraham et al., "High-Power Resonance Pulse Ac Hedp Sputtering Source and Method for Material Processing", U.S. Appl. No. 16/025,928 dated Jul. 2, 2018, 76 pages.

* cited by examiner

CAPACITIVE COUPLED PLASMA SOURCE FOR SPUTTERING AND RESPUTTERING

CROSS-REFERENCE TO RELATED APPLICATIONS

This application claims the benefit of U.S. Provisional Application No. 62/270,356, filed Dec. 21, 2015, the disclosure of which is incorporated herein by reference in its entirety. U.S. application Ser. No. 15/260,857 entitled "Electrically and Magnetically Enhanced Ionized Physical Vapor Deposition Unbalanced Sputtering Source", U.S. application Ser. No. 15/261,119 entitled "Magnetically Enhanced High Density Plasma-Chemical Vapor Deposition Plasma Source for Depositing Diamond and Diamond-Like Films", and U.S. application Ser. No. 15/261,197 entitled "Magnetically Enhanced Low Temperature-High Density Plasma-Chemical Vapor Deposition Plasma Source for Depositing Diamond and Diamond Like Films" filed concurrently herewith are incorporated herein by reference in their entireties.

BACKGROUND

Field

The disclosed embodiments generally relate to an ionized physical vapor deposition (I-PVD) apparatus and method for sputtering and resputtering of material on a surface of a semiconductor wafer that has recessed features, such as trenches and vias. The disclosed embodiments more particularly relate to a magnetically and electrically enhanced radio frequency (RF) diode I-PVD sputtering and resputtering apparatus and method.

Related Art

An I-PVD sputtering and resputtering process can be performed in the same process module in the presence of an additional inductively coupled plasma (ICP) source. An example of such an apparatus and process is described in U.S. Publication No. 2008/0190760A1, which is incorporated herein by reference in its entirety. A typical I-PVD sputtering source is a magnetron sputtering source, in which magnetic field lines primarily terminate on a target surface. The resputtering process, which is sputter etching, can be performed with argon gas ions or sputtered material ions. In order to increase ionization of the gas and sputtered target material atoms, typically an ICP coil is positioned in a vacuum chamber between a magnetron sputtering source and a substrate.

SUMMARY

The disclosed embodiments relate to an ionized physical vapor deposition (I-PVD) apparatus and method for sputtering and resputtering processes without the presence of an inductively coupled plasma (ICP) coil in the vacuum chamber. Sputtering and/or resputtering processes can be performed with a magnetically and electrically enhanced radio frequency (RF) diode plasma source positioned in a vacuum chamber. Magnetic field geometry of the magnetically and electrically enhanced RF diode plasma source does not form a conventional magnetron configuration on a cathode target surface. Magnetic field lines are substantially perpendicular to the cathode target surface and terminate on an electrode positioned around a sputtering target inside the anode. In some embodiments, two electrodes can be used.

The sputtering and resputtering apparatus and method can be used for manufacturing integrated circuit (IC) devices. Semiconductor wafers used in manufacturing IC devices have different aspect ratio vias and trenches. Throughout the manufacturing process, a diffusion barrier layer and a copper seed layer are sputtered inside the vias and trenches. For example, a diagram of a via 100 is shown in FIG. 1. Via 100 can be made in a dielectric layer 110 formed on the surface of semiconductor wafer. During the sputtering process, a target material 101, 102, 103 is sputtered on the surface of the dielectric 110 outside the via and inside the via. Bottom part (bottom coverage) 103 of the via 100 may have significant amounts of target material, and an insignificant amount of material is sputtered on the wall 102 of the via 100 or trench (side coverage) as shown in FIG. 1. Also during the sputtering process, an overhang area 104 forms on top of the via 100 which significantly reduces the probability that sputtered atoms penetrate inside the via. The ratio between the thickness of the bottom coverage and the side coverage depends on various parameters, such as a ratio of sputtered target material ions to sputtered material neutral atoms in the flux coming to the semiconductor wafer and semiconductor wafer voltage bias. A method to improve the side coverage and eliminate overhang includes resputtering, using gas or sputtered target material ions. In this case material from the bottom of the via is sputtered on the side of the via. Resputtering is defined herein as sputter etching of the already sputtered material by gas ions or by sputtered material ions. Sputter etching can be performed with noble gas ions, such as argon ions, or sputtered target material ions, such as copper ions. FIG. 2 shows a cross-sectional view of the via following sputter etching with argon or sputtered target material ions. The overhang 104 is sputter etched away, and a thickness of the side coverage 106 is improved by sputtering material 103 on the side of the via 100 as shown in FIG. 1. Thickness of the top coverage is also reduced. Additional sputtering and resputtering processes directed to the via 100 utilizing the sputtered material 109 may be performed to fill the via 100 as shown in FIG. 3.

The magnetically and electrically enhanced RF diode plasma source for sputtering and resputtering processes includes a cathode target assembly connected to a matching network and RF power supply or pulsed RF power supply, an anode connected to ground, a gap inside the anode, two rows of permanent magnets or electromagnets that are positioned on top of each other and face the same direction to generate a cusp magnetic field in the gap, a rotating cathode magnet assembly that generates magnetic field lines perpendicular to a surface of the cathode target and coupled with a cusp magnetic field in the gap, a flowing liquid that cools and controls the temperature of the cathode, and an electrode positioned behind the gap such that magnetic field lines cross the electrode and exposed to the plasma.

The magnetically and electrically enhanced RF diode plasma source for sputtering and resputtering may include a first pole piece between two rows of magnets that form a cusp magnetic field in the gap inside the anode, a second pole piece positioned on top of a top row of the magnets, a second gap inside the anode and a second pole piece, a second electrode positioned behind a second gap such that magnetic field lines cross the second electrode and are exposed to the plasma, a power supply connected to the first and second pole pieces or to the first and/or second electrodes, a direct current (DC) power supply or a pulsed DC power supply connected to the cathode target assembly, and a circuit connected between the cathode target assembly and ground which includes at least one inductor.

The magnetically and electrically enhanced RF diode apparatus includes a magnetically and electrically enhanced RF diode plasma source, a vacuum chamber, a substrate holder, a feed gas mass flow controller, a vacuum pump, an RF substrate bias power supply, and a matching network. The magnetically and electrically enhanced RF diode apparatus may include a substrate heater, controller, computer, and a gas activation source.

A method of providing magnetically and electrically enhanced RF diode I-PVD deposition includes positioning a magnetically and electrically enhanced RF diode plasma source inside a vacuum chamber, positioning a substrate on a substrate holder, applying electrical potential to an electrode, providing feed gas, applying RF power between a cathode target and an anode to form a plasma, applying RF power to the substrate holder to generate a substrate bias, depositing a layer of target material on the substrate surface, and continuously rotating the magnetic field lines crossing the cathode target surface.

The method of providing magnetically and electrically enhanced RF diode thin film deposition may include applying, in addition to RF power, a direct current (DC) or pulsed DC power between the cathode target and anode to increase a deposition rate of the thin film on the substrate, applying heat to the substrate, and passing feed gas through the gas activation source.

A method of providing magnetically and electrically enhanced RF diode sputter etching with feed gas ions includes positioning a magnetically and electrically enhanced RF diode plasma source inside a vacuum chamber, positioning a substrate on the substrate holder, applying electrical potential to the electrode, connecting the cathode target to ground through the circuit that has at least one inductor to control RF voltage bias on the cathode target, applying RF power between the cathode target and anode to form a capacitive coupled plasma with controlled RF voltage bias, applying RF power to the substrate holder to generate substrate bias, sputter etching the target material from the substrate surface, and rotating the magnetic field lines crossing the cathode target surface.

A method of providing magnetically and electrically enhanced RF diode sputter etching with feed gas ions may include applying heat to the substrate, passing feed gas through a gas activation source and rotating magnetic field lines crossing the cathode-target surface.

A method of ionized physical vapor deposition (I-PVD) sputtering of a layer on a substrate includes positioning a cathode, an anode, and a cathode magnet assembly in a vacuum chamber; providing a gap inside the anode around the cathode, wherein a cusp magnetic field is provided in the gap, and at least a portion of magnetic field lines associated with the cusp magnetic field pass through the gap and terminate on the cathode magnet assembly; positioning an electrode in the gap; connecting the cathode to a ground electrical potential through a circuit, wherein the circuit includes an inductor; providing a noble gas selected to sputter target material; applying radio frequency (RF) power to the cathode, thereby generating plasma discharge that ionizes sputtered target material; applying voltage to the electrode; and applying a negative bias voltage to the substrate, thereby attracting negatively charged sputtered material ions to the substrate.

A value of the negative bias voltage on the substrate may be in a range of about 10 to 200 V, a value of the cusp magnetic field in the gap may be in a range of about 200 to 10000 G, and the feed gas may be a mixture of the noble gas and a gas that comprises target material atoms. The feed gas may include a mixture of the noble gas and a reactive gas, the cathode magnet assembly may rotate at a speed in the range of 1 to 100 revolutions per minute, and the substrate may be a semiconductor wafer with a diameter in a range of 100 mm to 450 mm. A voltage on the electrode may be a negative pulsed voltage.

An apparatus that ionized physical vapor deposition (I-PVD) sputters a layer on a substrate includes a cathode, an anode, and a cathode magnet assembly positioned in a vacuum chamber; a gap provided inside the anode around the cathode, wherein a cusp magnetic field is positioned in the gap, and at least a portion of magnetic field lines associated with the cusp magnetic field pass through the gap and terminate on the cathode magnet assembly; an electrode positioned in the gap; a feed gas selected to sputter the layer on the substrate; a circuit connecting the cathode to radio frequency (RF) power, thereby generating plasma discharge that ionizes sputtered target material; and a bias power supply providing negative bias voltage to the substrate, thereby attracting positively charged ions from the sputtered target material that form a film on the substrate surface.

The electrode may include a floating electrical potential, the electrode may be connected to a power supply, and the cathode may be connected to a direct current (DC) power supply. A width of the gap may be in a range of 1-10 mm.

A method of generating high density plasma includes positioning a cathode, an anode, and a cathode magnet assembly in a vacuum chamber; providing a gap inside the anode around the cathode, wherein a cusp magnetic field is provided in the gap, and at least a portion of magnetic field lines associated with the cusp magnetic field pass through the gap and terminate on the cathode magnet assembly; positioning an electrode in the gap; providing a feed gas selected to generate high density plasma; applying voltage to the electrode; and applying radio frequency (RF) power to the cathode, thereby generating plasma discharge that generates high density plasma;

A value of the cusp magnetic field in the gap may be in a range of about 200 to 10000 G, the feed gas may include a mixture of a noble gas and a reactive gas, and the cathode magnet assembly may rotate at a speed in a range of 1 to 100 revolutions per minute. The substrate may be a semiconductor wafer with a diameter in a range of 100 to 450 mm. The voltage on the electrode may be a negative pulsed voltage, and the cathode may be connected to a ground electrical potential through a circuit comprising an inductor.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein:

FIG. 5 (b) shows an illustrative cross-sectional view of components and magnetic field lines for a magnetically and electrically enhanced radio frequency (RF) diode plasma source with one pole piece or electrodes exposed to plasma and separated from the anode by dielectric;

FIG. 5 (c) shows an illustrative cross-sectional view of the pole piece with gap and magnetic field lines for a magnetically and electrically enhanced radio frequency (RF) diode plasma source;

FIG. 5 (d) shows an illustrative cross-sectional view of magnetic field lines for a magnetically and electrically enhanced radio frequency (RF) diode plasma source with two pole pieces and one electrodes exposed to plasma;

FIG. 5 (e) shows an illustrative cross-sectional view of magnetic field lines for a magnetically and electrically enhanced radio frequency (RF) diode plasma source with two pole pieces/electrodes connected to two power supplies;

FIG. 5 (f) shows an illustrative cross-sectional view of magnetic field lines for a magnetically and electrically enhanced radio frequency (RF) diode plasma source with two pole pieces and two electrodes connected to two power supplies;

FIG. 5 (g) shows an illustrative cross-sectional view of magnetic field lines for a magnetically and electrically enhanced radio frequency (RF) diode plasma source without pole pieces and with one electrode;

FIG. 5 (f) shows an illustrative cross-sectional view of magnetic field lines for a magnetically and electrically enhanced radio frequency (RF) diode plasma source with two pole pieces and two electrodes connected to two power supplies;

FIG. 5 (h) shows an illustrative cross-sectional view of magnetic field lines for a magnetically and electrically enhanced radio frequency (RF) diode plasma source when one pole piece is hidden behind the anode;

Figure 1:
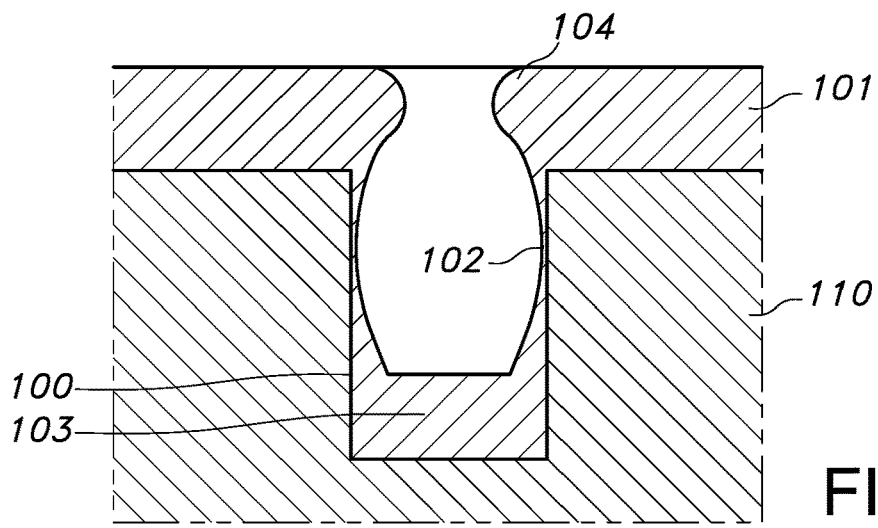
FIG. 1 shows an illustrative cross-sectional image of a via after deposition of a target material.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Resputtering is defined herein as the sputter etching of a sputtered layer. The sputter etching process can be performed with argon gas ions, sputtered target material ions, or a combination thereof. The sputtering and resputtering processes can be performed in the same process module. Capacitive coupled plasma is formed near a sputtering target. An electric circuit controls RF constant voltage bias on the sputtering target during the sputtering and resputtering processes.

In contrast to conventional radio frequency (RF) diodes, a magnetically and electrically enhanced RF diode plasma source 200 includes an anode 201, cathode target 202, two rows of magnets 203, 204, and two magnetic pole pieces 206, 210 as shown in FIGS. 4 (a) and 5 (a). The magnetic pole-pieces 206, 210 concentrate magnetic field lines 208 and 209 and function as additional electrodes. The pole pieces/electrodes 206, 210 can be made from non-magnetic material, in which case the pole pieces/electrodes 206, 210 do not concentrate a magnetic field and function as additional electrodes. The pole pieces/electrodes 206, 210 can have a different shape and may have a gap between them. The two rows of magnets 203, 204 face each other, provide a magnetic field in the same direction (south-south or north-north) and, therefore, generate cusp magnetic field geometry in a first gap 205 inside the anode 201. The pole piece/electrode 206 is disposed between two rows of magnets 203, 204. The pole piece/electrode 206 can be made from magnetic or nonmagnetic material. The pole pieces/electrodes 206, 210 can be connected to a power supply 207. The power supply 207 can be a pulsed power supply, direct current (DC) power supply, pulsed DC power supply, RF power supply, pulsed RF power supply, or alternating current (AC) power supply. In an embodiment, pole piece/electrode 206 has a floating or ground potential without being connected to any power supply.

Magnetic field lines 208 from the bottom row of magnets 204 penetrate the cathode surface at a substantially 90 degree angle. Magnetic field lines 209 from the top row of the magnets 203 terminate on the second magnetic pole piece 210 positioned on top of the top row of magnets 203. The top magnetic pole piece/electrode 210 is a second pole piece/electrode 210 that can be exposed to plasma through a second gap 211 inside the anode 201. The second pole piece/electrode 210 can also be connected to the power supply 207. In an embodiment, the second pole piece/electrode 210 has a floating or ground potential. The magnetic pole pieces/electrodes 210, 206 are isolated from magnets 203, 204 by dielectric pieces 212. Magnetic field lines 208, 209 generate a cusp magnetic field in the gap 205. Power supply 213 applies RF power to the cathode target 202 through a matching network 214. RF power ignites and sustains the plasma. During discharge of RF power, a surface of the cathode target 202 emits secondary electrons. Since the magnetic field lines are perpendicular to the cathode surface, the magnetic field lines do not confine secondary electrons near the cathode target surface, as in magnetron sputtering sources. Rather, the subject magnetic field geometry allows secondary electrons to move from the cathode target surface toward the gap between the anodes. Magnetic field lines that penetrate the cathode surface guide the emitted electrons from the cathode surface to the first gap 205 between the anodes as shown in FIG. 5 (a) by arrow 214.

By the time the emitted electrons arrive at the first gap, a portion of their initial energy has been lost due to dissociation, ionization, and/or elastic and/or non-elastic collisions with neutral atoms, ions, and/or other electrons. One portion of the electrons drift back from the first anode gap 205 towards the cathode target surface 202 as shown by arrow 215 in FIG. 5 (a). Another portion of the electrons drift towards the second anode gap 211 as shown by arrow 216 in FIG. 5 (a). The electrons reflect from points A and C due to a magnetic mirror effect, and reflect from points B and D due to presence of negative potential on the first and second pole pieces/electrodes 206, 210 as shown in FIG. 5 (a). By the time these electrons arrive at the second anode gap 211, a portion of their initial energy has been lost due to dissociation, ionization, and elastic, and non-elastic collisions with neutral atoms, ions, and other electrons. These electrons can drift back to the first gap 205 between the anodes as shown by arrow 217. Thus, the electrons move back and forth between the cathode target surface 202 and first and second anodes gaps 205, 211.

In some embodiments, dielectric pieces 218, 219 are positioned between anode 201 and magnets 203, 204 as shown in FIG. 5 (b). In some embodiments, the pole piece/electrode 220 can be made from nonmagnetic material and have a gap 221 as shown in FIG. 5 (c).

During a reactive sputtering process, positive charge can be formed on the cathode target surface 202 due to reactive feed gas interaction with the cathode target surface 202. If pulsed RF power is applied to the cathode target, some electrons will reach the cathode target surface 202 as shown by arrow 215 in FIG. 5 (a) during the time period between RF power pulses when the cathode voltage is equal to zero. These electrons discharge a positive charge on top of the cathode surface and significantly reduce or completely eliminate the probability of arcing on the cathode target surface 202.

Figure 4A:
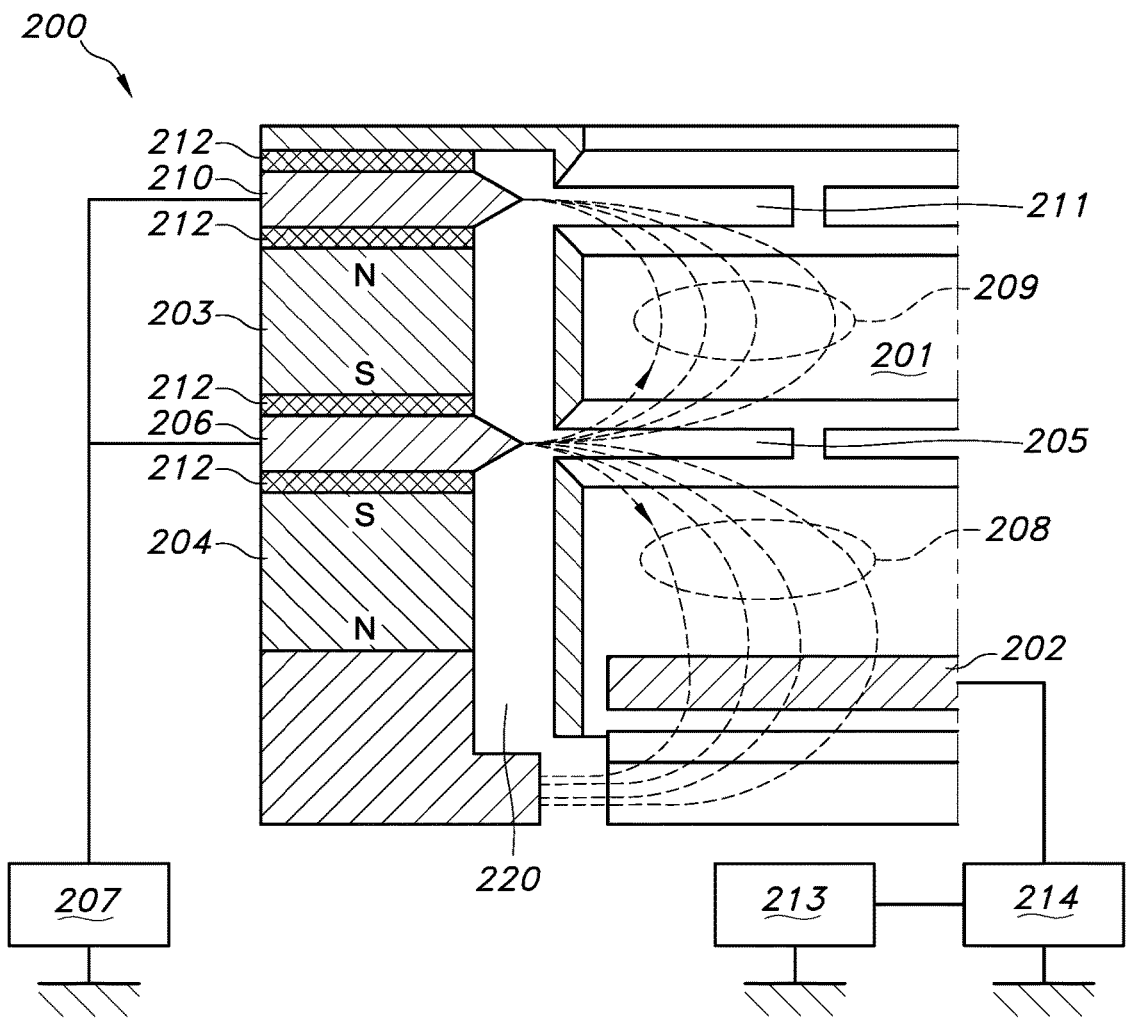
FIG. 4(a) shows an illustrative cross-sectional view of components and magnetic field lines for a magnetically and electrically enhanced radio frequency (RF) diode plasma source with two pole piece/electrodes exposed to plasma.
Figure 4B:
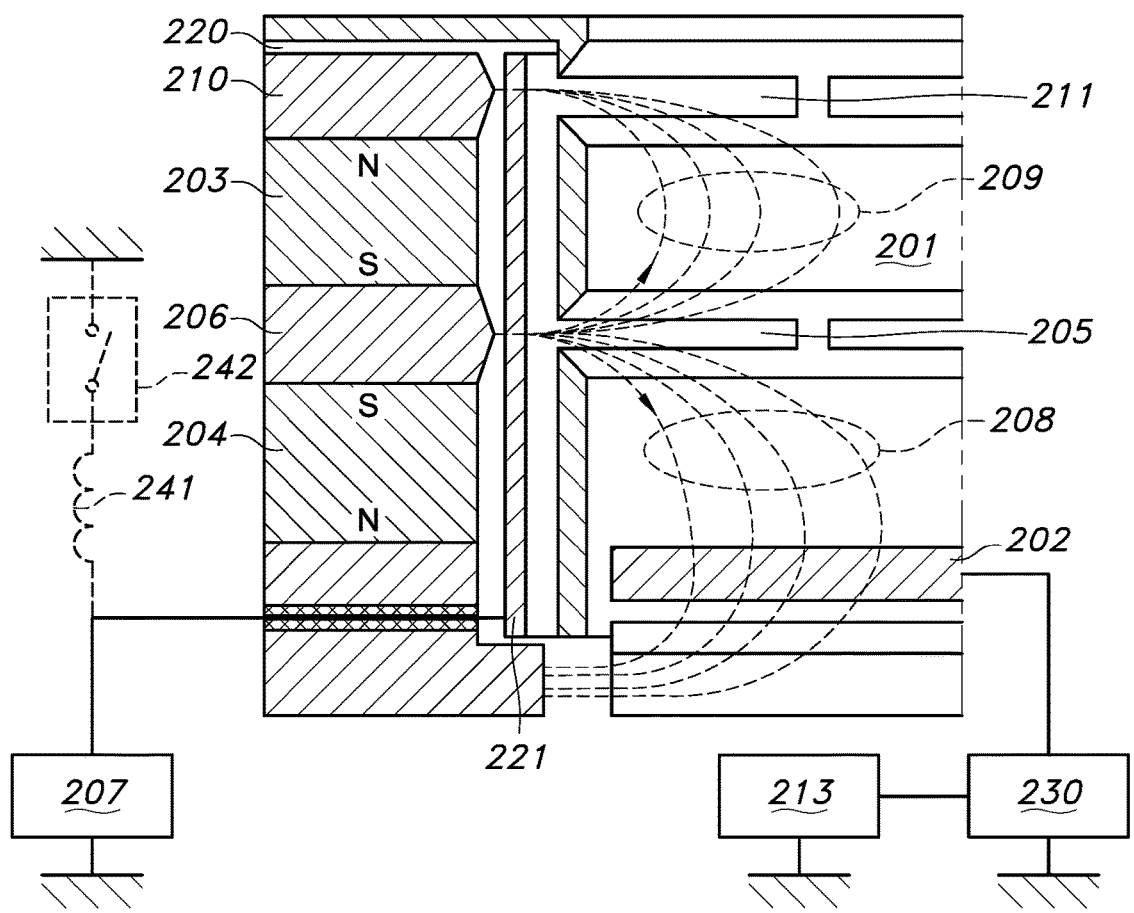
FIG. 4(b) shows an illustrative cross-sectional view of components and magnetic field lines for a magnetically and electrically enhanced radio frequency (RF) diode plasma source with two pole pieces and one electrode exposed to plasma.
Figure 5D:
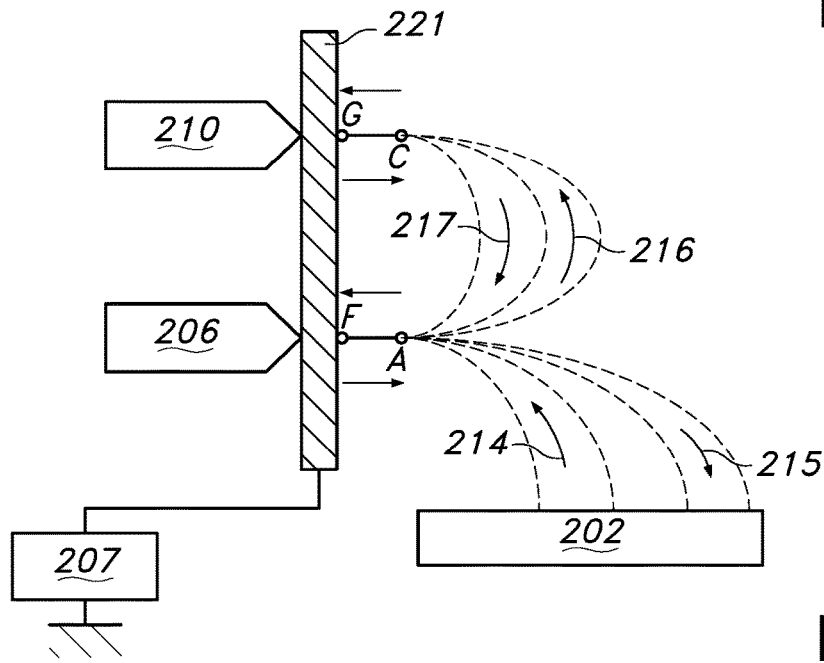
Figure 4C:
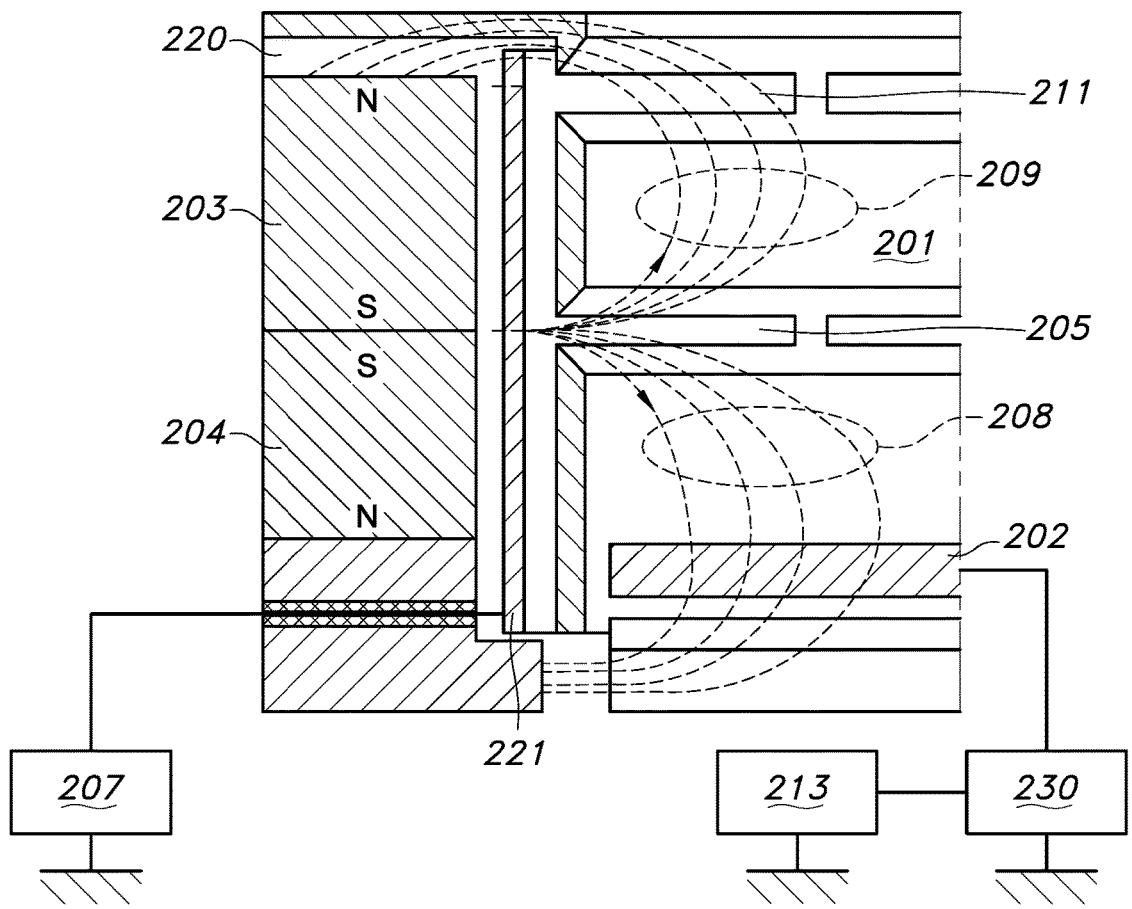
FIG. 4(c) shows an illustrative cross-sectional view of components and magnetic field lines for a magnetically and electrically enhanced radio frequency (RF) diode plasma source without pole pieces and with one electrode exposed to plasma.
Figure 5G:
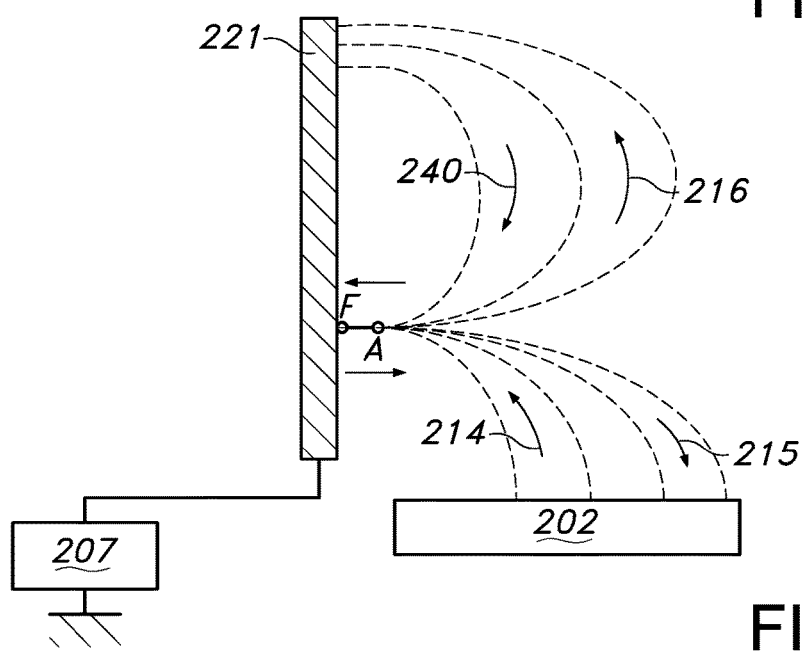

The pole pieces 206 and 210 can be hidden behind the separate electrode and, in this case, pole pieces 206 and 210 are not electrodes anymore and they are not connected to the power supply. The electrode are connected to the power supply 207 and exposed to the plasma through the gap 211 and 205 as shown in FIGS. 4(b) and 5 (d). During the movements, the electrons will reflect from points G and F due to the presence of a negative potential or the electrons will be absorbed due to the presence of positive potential. The power supply 207 can be an RF power supply. The electrode 221 can be grounded through the inductor in order to eliminate negative voltage bias generated by RF discharge.

The pole pieces/electrodes 210 and 206 can be connected to the different power supplies 231 and 207 as shown in FIG. 5 (e). These power supplies can simultaneously generate different voltage on these electrodes. Power supplies 231 and 207 can be RF power supplies with different frequencies. The controller 234 can control the output voltage of these power supplies and time shift between two voltage signals. The pole pieces 210 and 206 can be hidden behind electrodes 233 and 232. The electrodes can be connected to the different power supplies 231 and 207 as shown in FIG. 5 (f). These power supplies can simultaneously generate different voltages on these electrodes. Power supplies 231 and 207 can be RF power supplies with different frequencies. The controller 234 can control the output voltage of these power supplies and time shift between two voltage signals.

In an embodiment, there are no pole pieces 210 and 206 as shown in FIGS. 4 (c) and 5 (g). In this case, the electrons that will move towards second gap can be reflected by negative potential from the electrode 221 as shown by arrow 240 or escape on the anode 201.

Figure 4D:
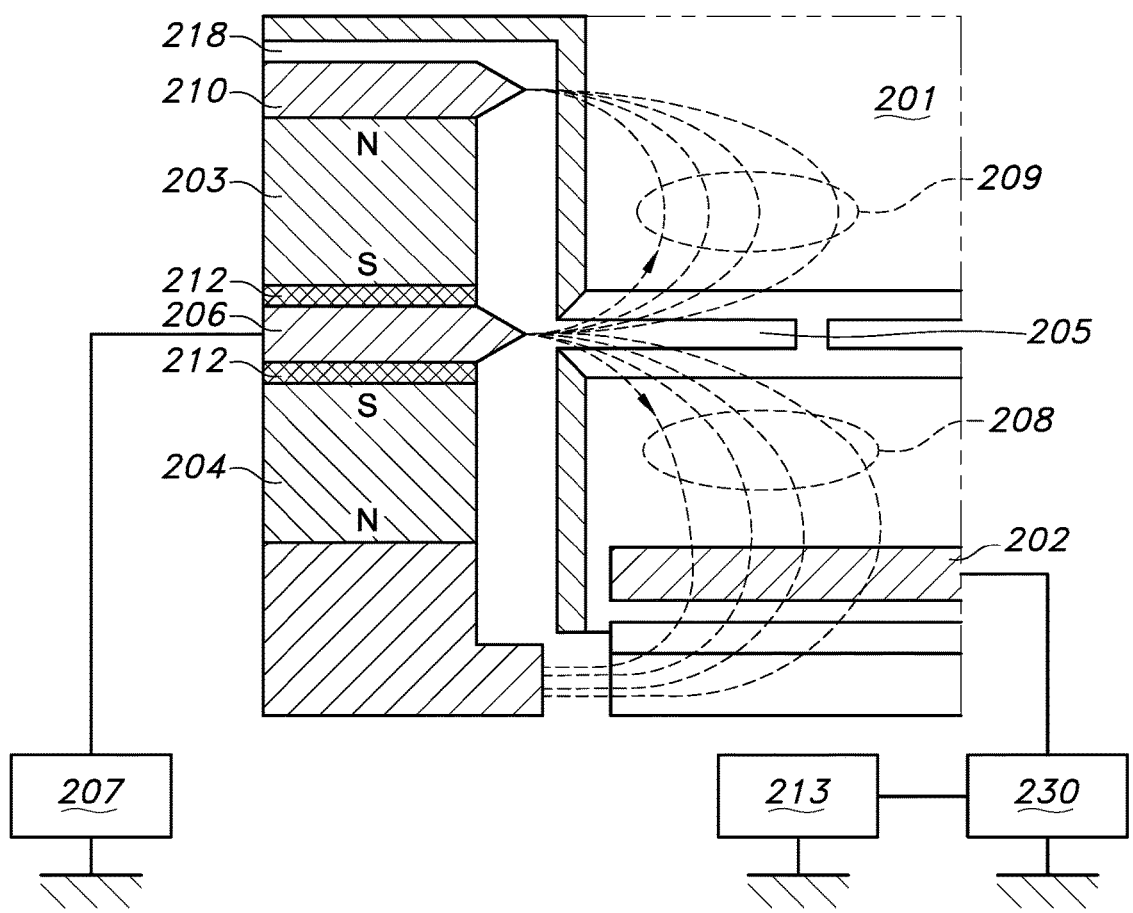
FIG. 4(d) shows an illustrative cross-sectional view of components and magnetic field lines for a magnetically and electrically enhanced radio frequency (RF) diode plasma source with one pole piece and one pole piece/electrode that is exposed to plasma.
Figure 5H:
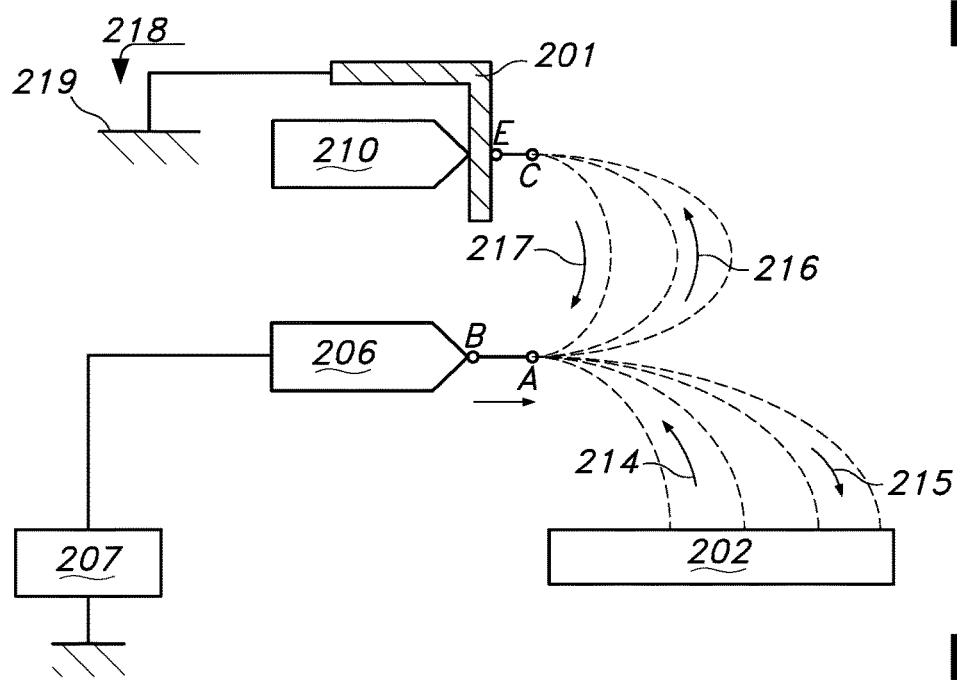
Figure 5B:
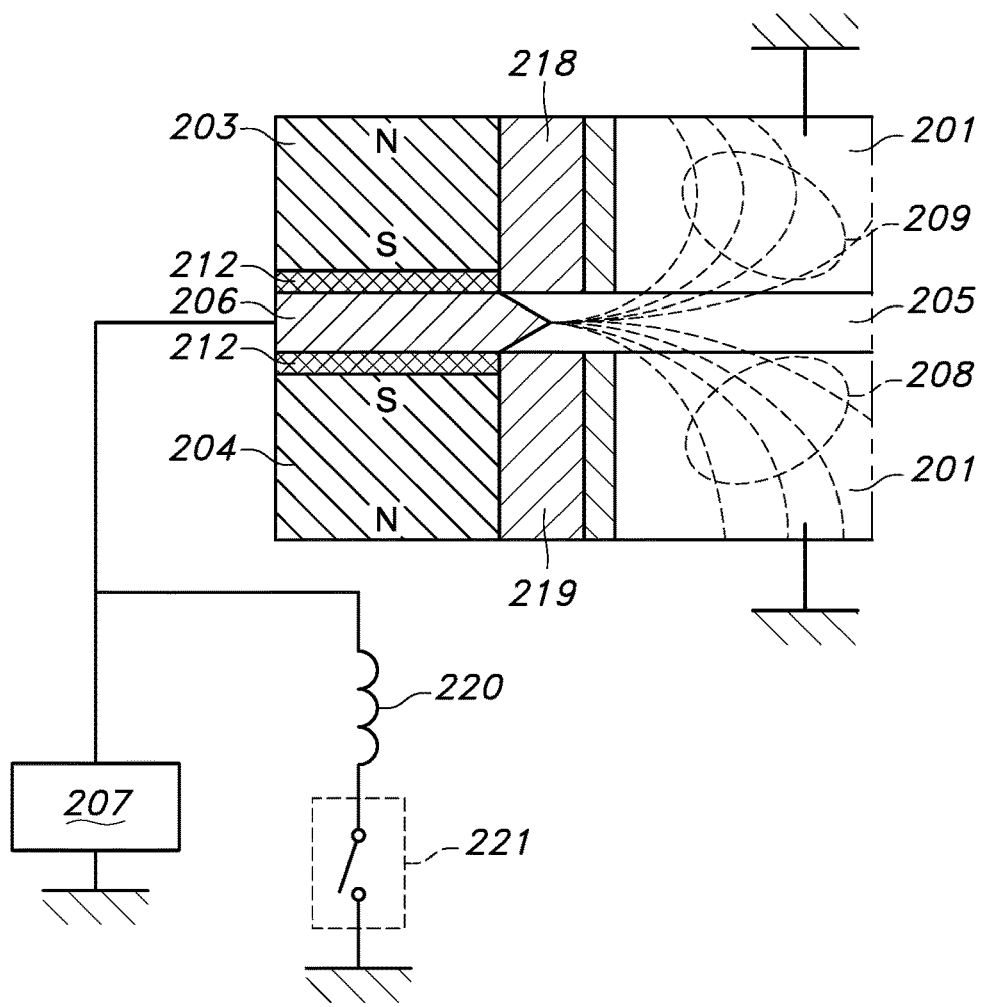
Figure 5C:
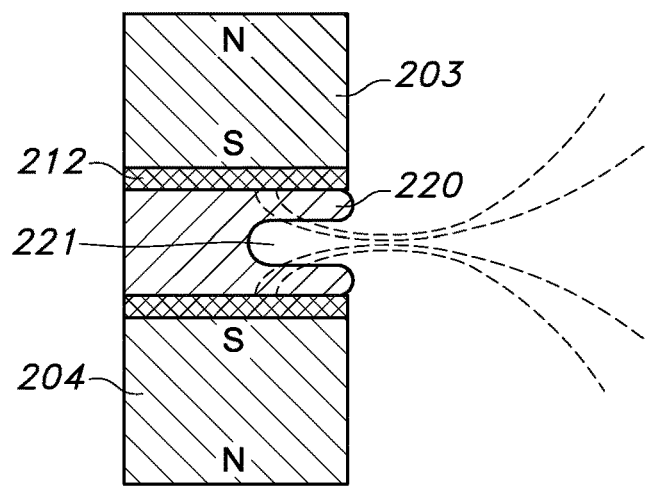
Figure 5E:
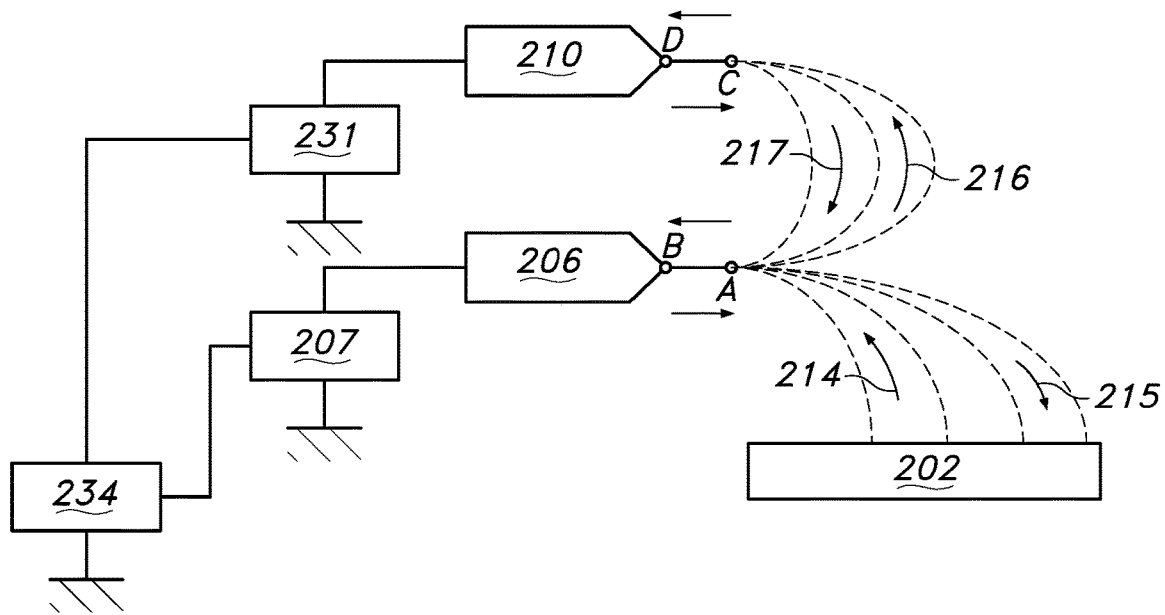
Figure 5F:
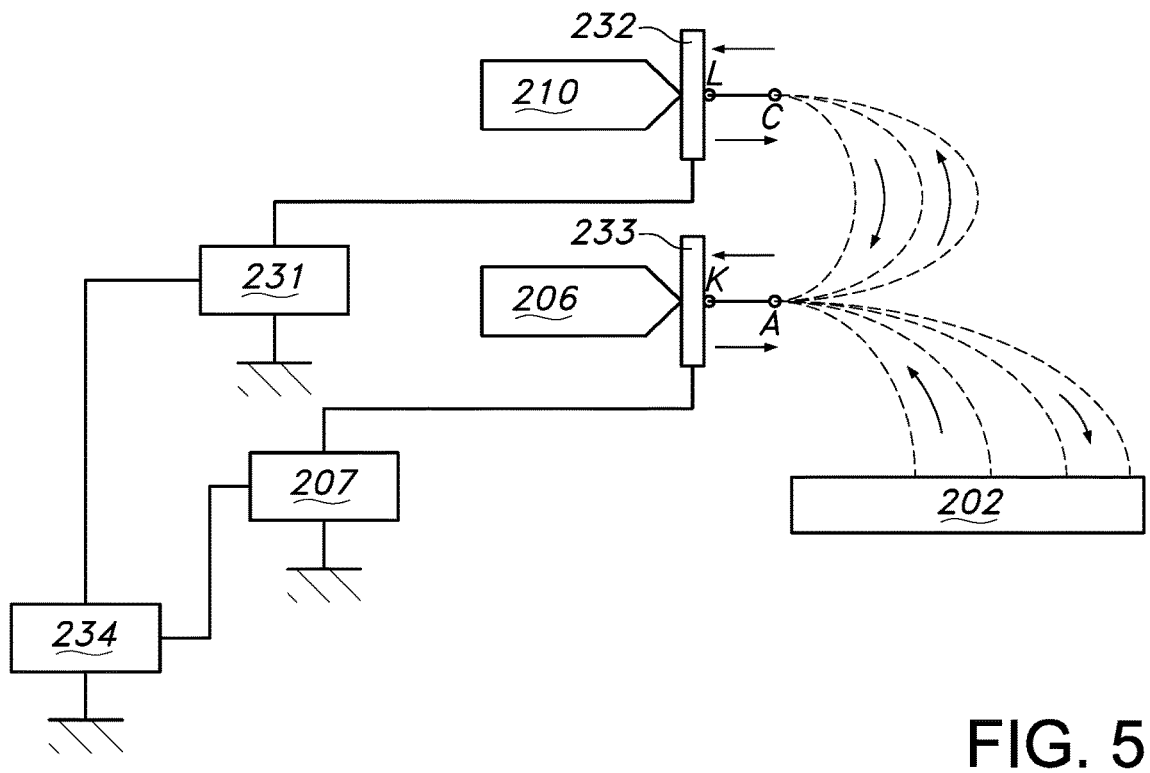
Figure 6A:
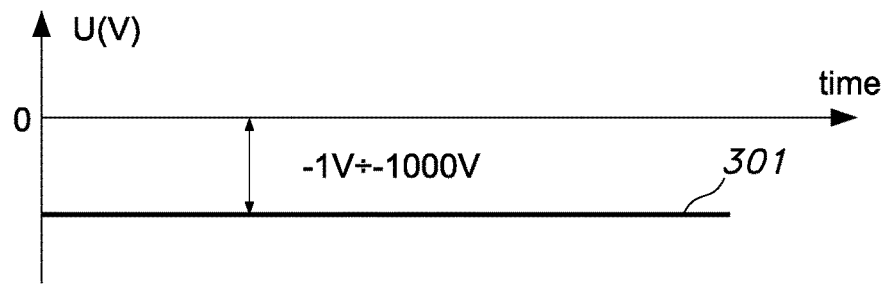
FIGS. 6 (a, b, c, d, e) show illustrative views of different voltage waveforms that can be applied to the pole pieces or electrodes.
Figure 6B:
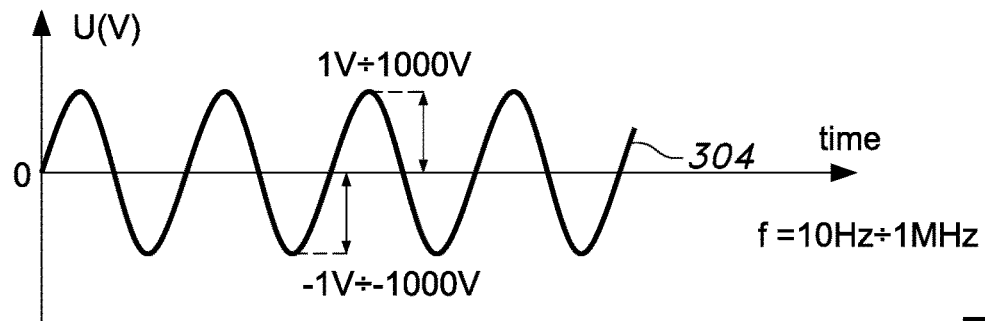
Figure 6C:
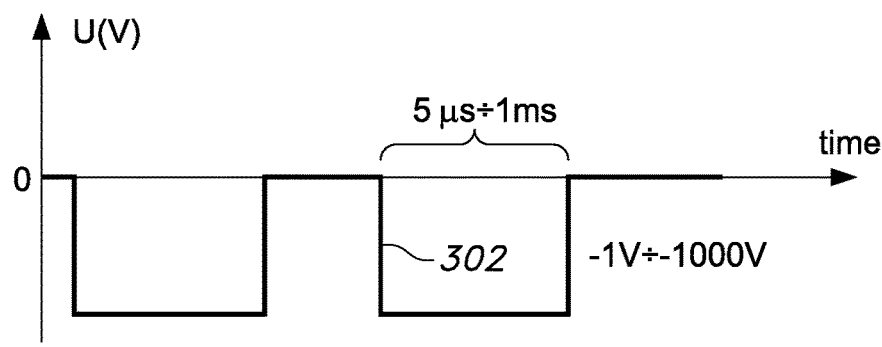
Figure 6D:
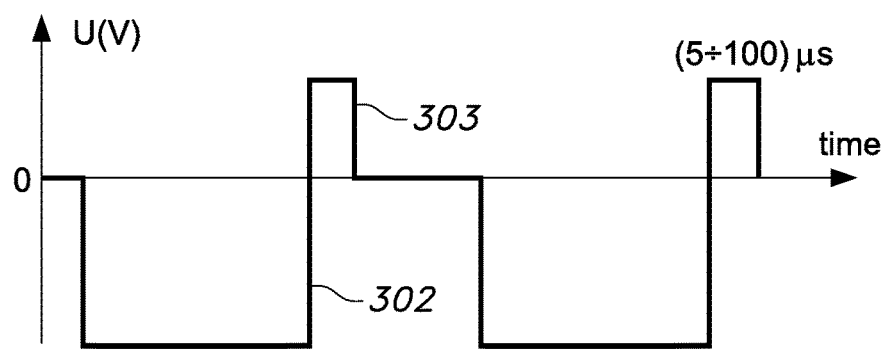
Figure 6E:
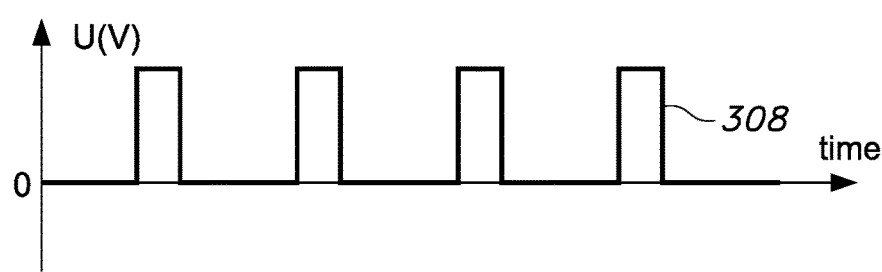

In an embodiment, the pole piece 210 is hidden behind the anode 241 as shown in FIGS. 4(d) and 5 (h). In this case, there is only one gap 205. The electrons that were not reflected in point C due to magnetic mirror effect will escape on the anode in point E. In the same embodiment, there is no pole piece 210 and there is electron reflection due to a magnetic mirror effect at point C.

Figure 7A:
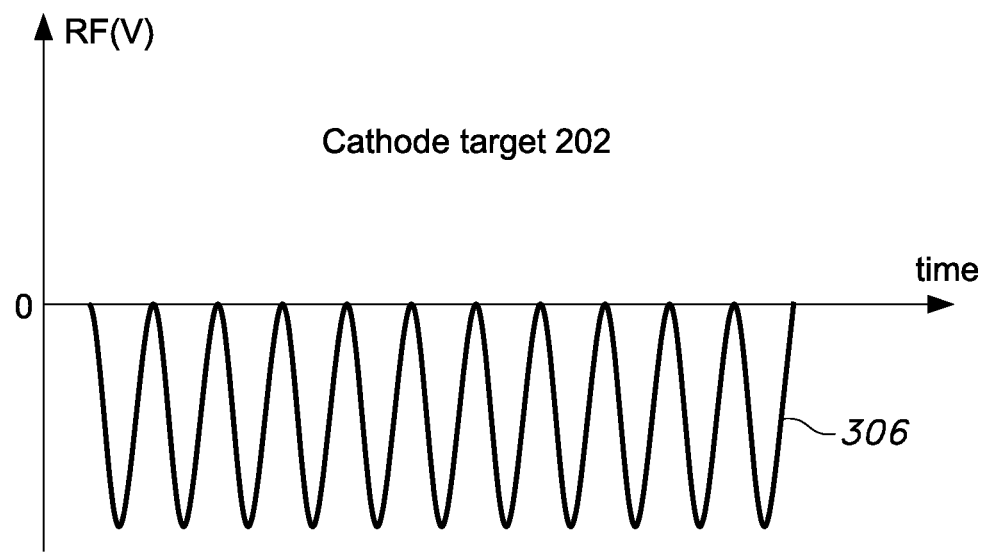
FIGS. 7 (a, b) show illustrative views of continuous voltage signals that can be applied to a cathode target and to the pole pieces or electrodes, respectively, during a sputtering step.
Figure 7B:
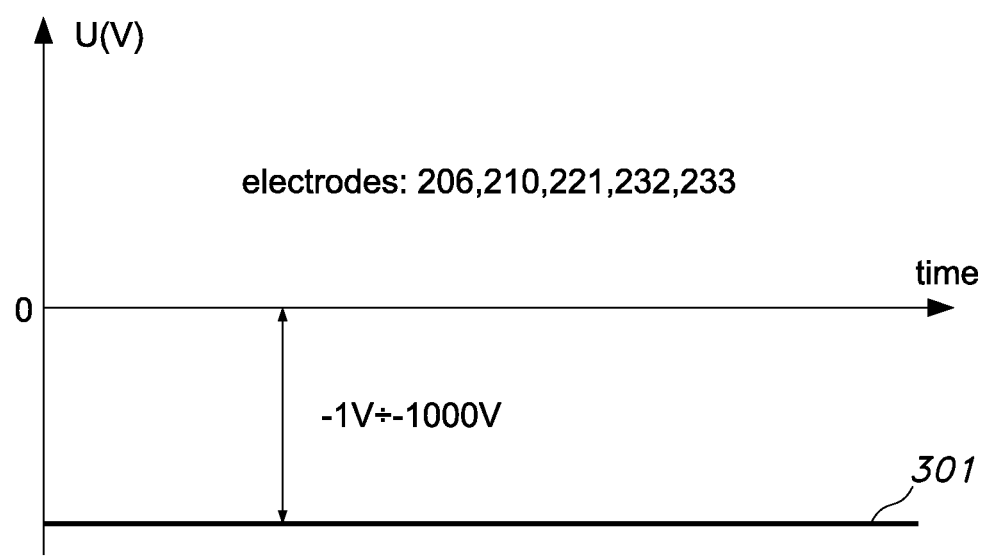
Figure 8A:
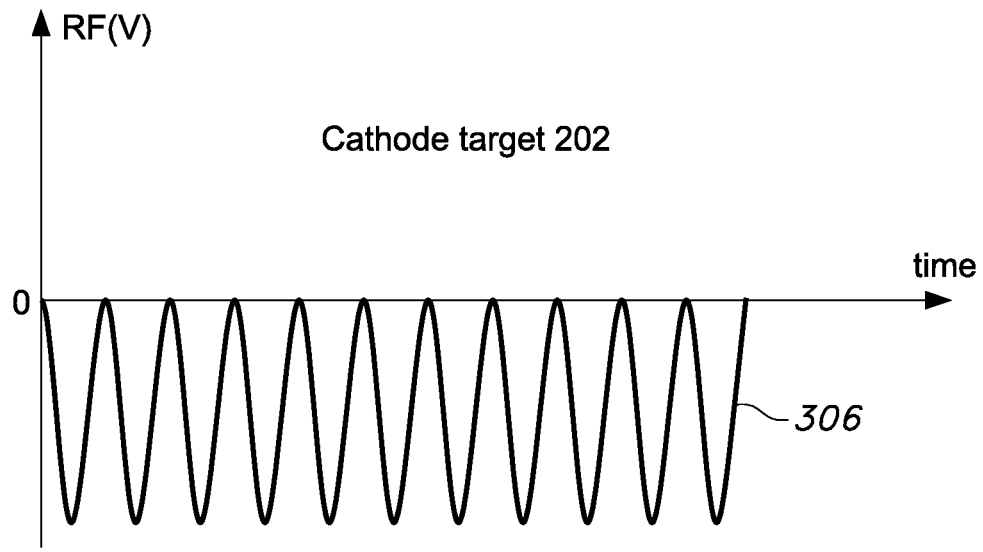
FIGS. 8 (a, b) show illustrative views of continuous and pulsed voltage signals that can be applied to the cathode target and the pole pieces or electrodes, respectively, during the sputtering step.
Figure 8B:
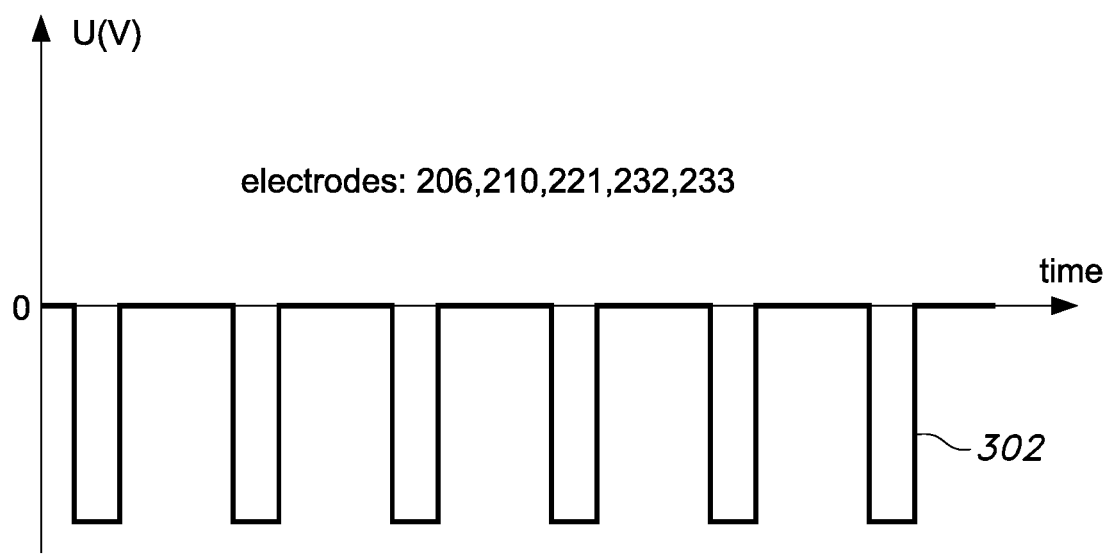
Figure 9A:
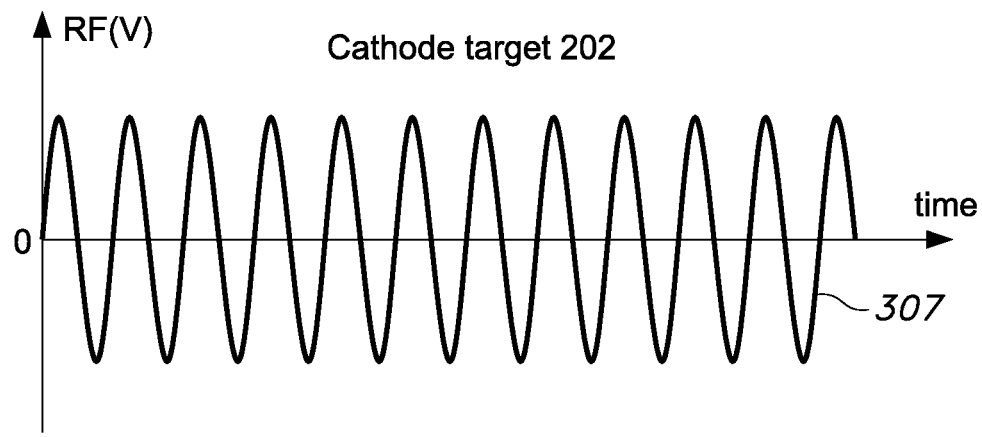
FIGS. 9 (a, b, c) show illustrative views of continuous and pulsed voltage signals that can be applied to the cathode target and the first electrode, respectively, during a sputter etching step.
Figure 9B:
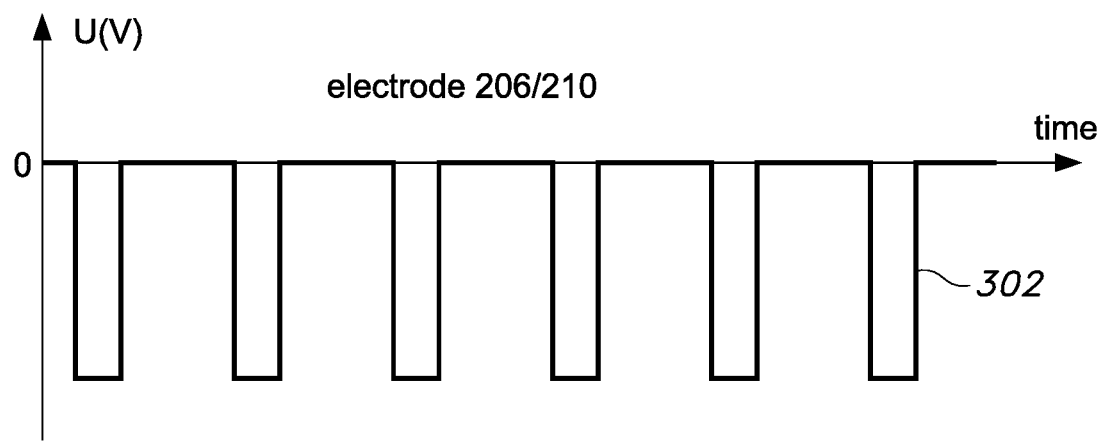
Figure 9C:
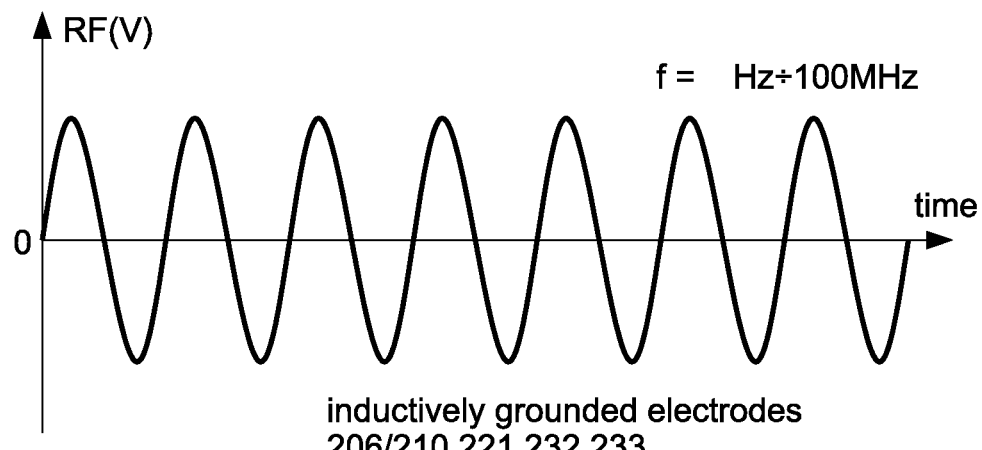

Power supply 207 can generate different voltage waveforms as shown in FIGS. 6 (a, b, c, d, e) that can be applied to the pole pieces/electrodes 206, 210 or to the electrodes 221, 232, and 233. FIG. 6 (a) shows a continuous constant negative voltage 301 in a range of −1 to −1000 V. This voltage maintains electrons inside the plasma discharge generated by RF voltage 306 to control plasma density as shown in FIGS. 7 (a, b). The power supply 207 can generate bipolar voltage as shown in FIG. 6 (b). During a positive voltage, the electrons will be accelerated towards the pole pieces/electrodes 206, 207 or electrodes 221, 232 and 233 and will be repealed during a negative voltage. Such type of electron movements depends on voltage frequency and voltage amplitude can significantly increase electron energy. Voltage from the power supply 207 can be applied by negative unipolar voltage pulses 302 as shown in FIGS. 6 (c) and 8 (b). Voltage from the power supply 207 can be applied by rectangular bipolar voltage pulses as shown in FIG. 6 (d). By applying positive voltage pulses 308 from the power supply 207, as shown in FIG. 6(e), to the electrodes 206, 210, 221, 232 and 233 during the plasma discharge, it is possible to absorb electrons and generate positive space charge in the plasma. The positive charge can provide additional energy to the ions in the plasma. FIG. 9 (a) shows an RF cathode target voltage when the RF DC bias equals zero. Negative voltage pulses applied to the electrodes 206, 210, 221, 232 and 233 as shown in FIG. 9 (b) can increase electron energy during electron movement between electrode 206 and the cathode target surface 202. In some embodiments, electrode 206, 207, 221, 232 and 233 can be inductively grounded through inductor 241 and switch 242 in order to eliminate a constant voltage bias generated by RF power supply 207 as shown in FIG. 4 (b). RF voltage applied to the inductively grounded electrodes 206, 210, 221, 232 and 233, as shown in FIG. 9 (c), can increase electron energy during electron movement between electrodes 206, 210, 221, 232 and 233 and the cathode target surface 202.

Figure 10:
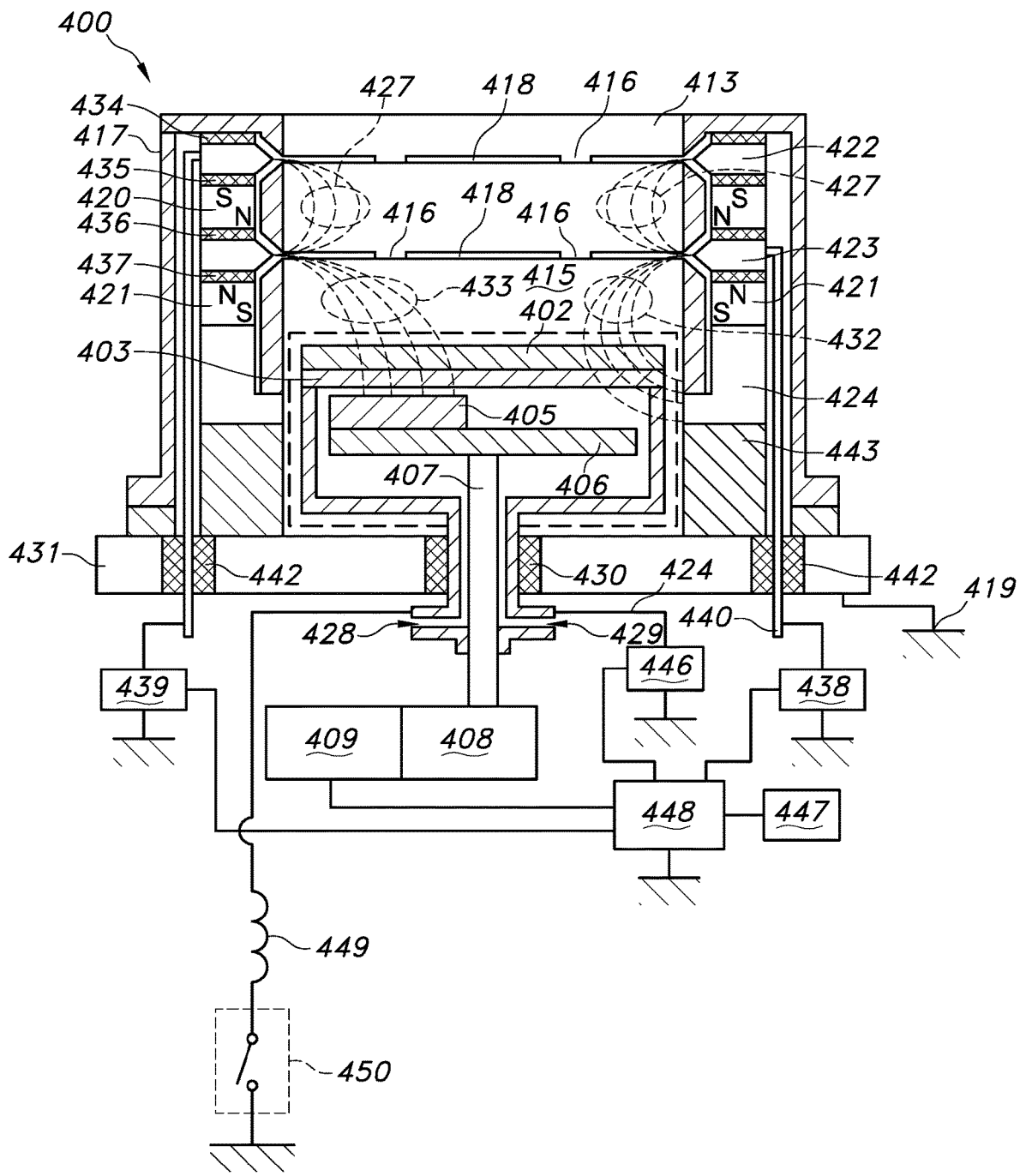
FIG. 10 shows an illustrative cross-sectional view of the magnetically and electrically enhanced RF diode plasma source.

FIG. 10 shows a cross-sectional view of an embodiment of the magnetically enhanced RF diode plasma source 400. The magnetically enhanced RF diode plasma source 400 includes a base plate 431. The base plate 431 is electrically connected to ground 419. A cathode assembly 401 includes a water jacket 404 and a cathode target 402. The cathode target 402 can be bonded to a copper backing plate 403 or can be attached to the copper backing plate 403 with a clamp (not shown). The water jacket 404 is electrically isolated from the base plate 431 with isolators 430. Water or another fluid used for cooling can move into the water jacket 402 through inlet 428, and can exit the water jacket 402 through outlet 429. The water jacket 404 and, therefore, cathode target 402 are electrically connected to a negative terminal of a power supply 446 through a transmission line 424. The power supply 446 can include a radio frequency (RF) power supply, pulsed RF power supply, high frequency (HF) power supply, and/or pulsed HF power supply and a matching network. The power supply 446 can also include a direct current (DC) power supply, a pulsed DC power supply that generates unipolar negative voltage pulses, a pulsed DC power supply that generates asymmetrical bipolar voltage pulses, and/or a pulsed DC power supply that generates symmetrical bipolar voltage pulses. The power supply 446 can be a combination of any power supplies mentioned above. For example, the RF power supply can provide power together with a DC power supply, or a pulsed RF power supply can provide power together with a pulsed DC power supply, or any other pulsed power supply. The frequency of the RF power supply and HF power supply can be in the range of 100 kHz to 100 MHz. The above-mentioned power supplies can operate in current control mode, in voltage control mode, and/or in power control mode. The cathode target 402 is formed in the shape of a disk, but can be formed in other shapes, such as a rectangle, and the like. The cathode target 402 material can be conductive, semi-conductive, and/or non-conductive. The following chemical elements or a combination of any two or more of these elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases $O_2$, $N_2$, F, Cl, and/or $H_2$ can also be used as a cathode material. Power supply 446 is connected to a controller 448 and computer 447. Controller 448 and/or computer 447 control output power values and timing of the power supplies 438 and 439. Power supply 446 can operate as a standalone unit without connection to the controller 448 and/or computer 447.

The cathode assembly 401 includes a rotatable cathode magnetic assembly 405 positioned inside the water jacket 404. The cathode magnetic assembly 405, in an embodiment, includes a disc-shaped magnetic pole piece made from a magnetic material, such as iron. The cathode magnetic assembly 405 is mounted on a supporter 406 that is made from a non-magnetic material. The supporter 406 is mechanically connected to a shaft 407. Shaft 407 is connected to a gear box 408 and motor 409. Motor 409 is connected to controller 448. The presence of the cathode magnetic assembly 405 provides for a perpendicular direction of the magnetic field lines to the surface of the cathode. In an embodiment, the cathode magnetic assembly 405 includes a plurality of permanent magnets and magnetic pole pieces. The shape of the cathode magnetic assembly 405 determines the angle between the magnetic field lines and a surface of the cathode. In an embodiment, the cathode magnetic assembly 405 is rotatable. In an embodiment, the cathode magnetic assembly 405 is kidney-shaped. The magnetic assembly 405 can rotate with a speed in the range of 1 to 500 revolutions per minute. In an embodiment, the area of the cathode magnetic assembly 405 is no greater than 25% of the cathode target area. In an embodiment, the area of the cathode magnetic assembly 405 is no greater than 50% of the cathode target area.

Ring-shaped anodes 415, 414, 413 are positioned around the cathode target 402. The anodes 415, 414 form a circular gap 418. The anodes 413, 414 form a circular gap 418. The gap 418 is controlled by anode step 416. The gap size can be in the range of 0.5 to 10 mm.

The anode magnet assembly has a cylindrical shape and is positioned behind the ring-shaped anodes 415, 414, 413. The anode magnet assembly includes magnetic ring-shaped pole pieces 422, 423, 424 and a plurality of permanents magnets 420, 421. The magnets 420, 421 are positioned inside a magnet housing (not shown). The magnets 420, 421 face each other and are in the same direction in order to generate a cusp magnetic field in the gap 418. The value of the magnetic field caused by the magnets 420, 421 is in a range of 100 to 10000 G. Magnetic pole pieces 424, 423, cathode magnetic assembly 405, and magnet 421 generate magnetic field 433. Magnetic pole pieces 424, 423, and magnet 421 generate magnetic field 432. Due to rotation of the cathode magnetic assembly 405, the position of the magnetic fields 433, 432 changes. Magnetic pole pieces 422, 423 and magnet 420 generate magnetic field 427. The pole piece 416 is mounted on top of a support 443.

The pole piece 422, 423 are electrically isolated from the magnet 420 by isolators 435, 436. The pole piece 423 is electrically isolated from the magnet 421 by isolator 437. The pole piece 422 is electrically isolated from the anode 413 by isolator 434.

The magnetic fields 433, 427 are shaped to provide electron movement between the cathode target 402 and pole pieces 423, 422. During this movement, electrons ionize feed gas molecules and/or atoms.

The pole pieces 423, 422 may have a different design. The portion of the pole pieces that is exposed to the gap 418 may have a triangular shape or have a gap in the middle. In an embodiment, the magnets 420, 421 are electromagnets.

The shape of the magnetic pole piece 423, and the value and geometry of the magnetic field 433 and 427 determine the point of magnetic reflection of the electrons due to the magnetic mirror effect. In an embodiment, the magnet assembly 405 forms magnetron configuration.

The cathode assembly can be inductively grounded through inductor 449 and switch 450.

Figure 11:
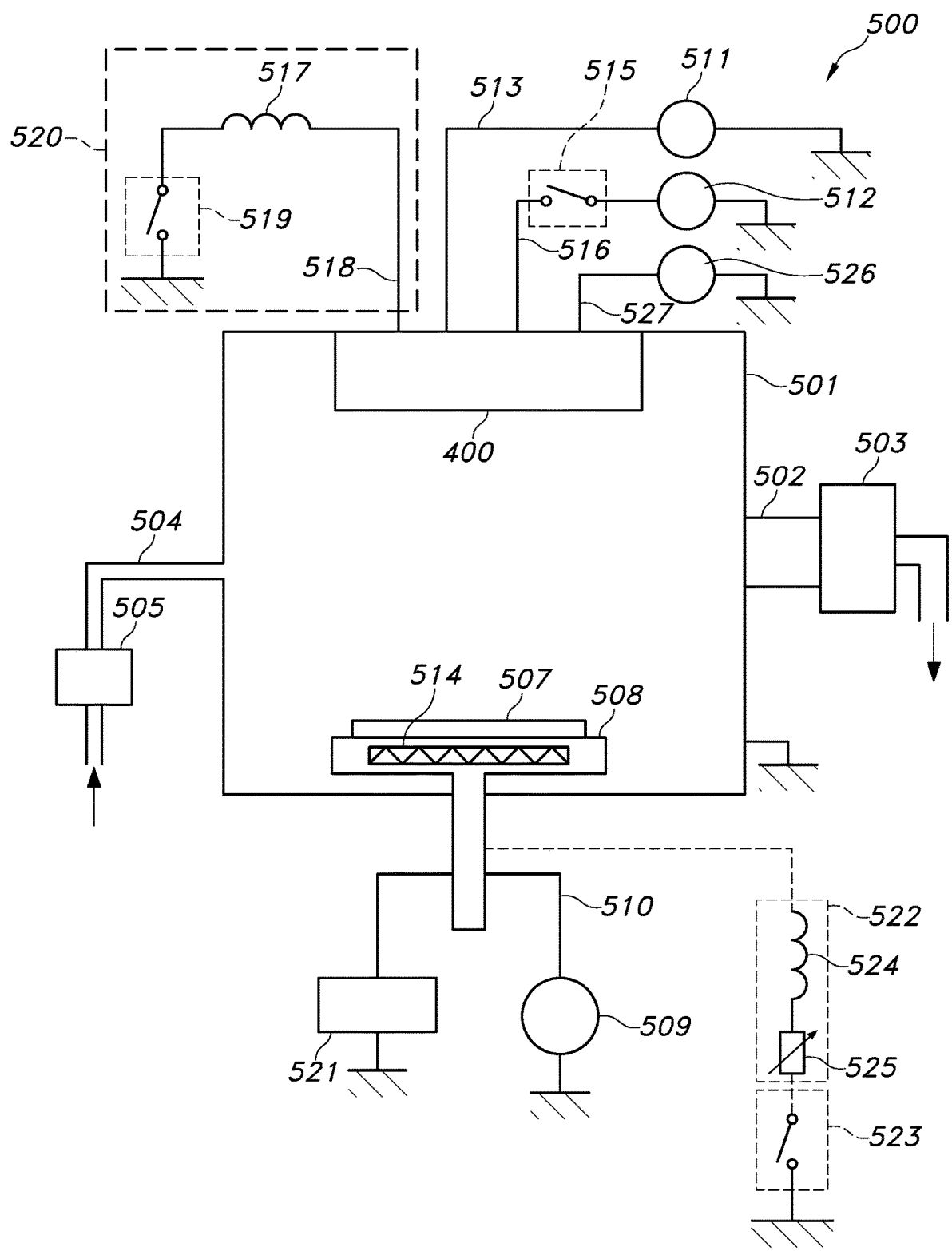
FIG. 11 shows an illustrative block diagram of the magnetically and electrically enhanced RF diode plasma apparatus.
Figure 12A:
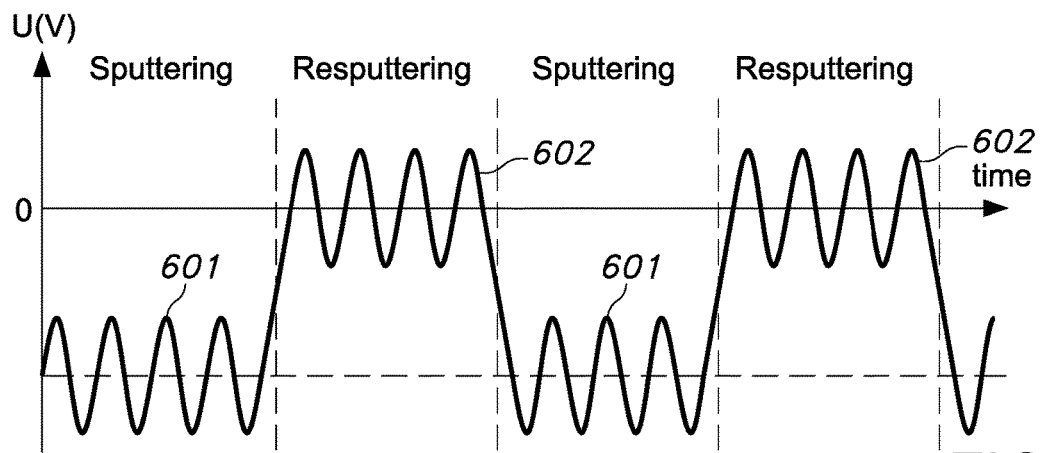
FIGS. 12 (a, b, c, d) show illustrative diagrams of DC bias voltages generated by a radio frequency (RF) power supply and a direct current (DC) power supply on the cathode target of the magnetically and electrically enhanced RF diode plasma source during the sputtering and sputter etching processes.
Figure 12B:
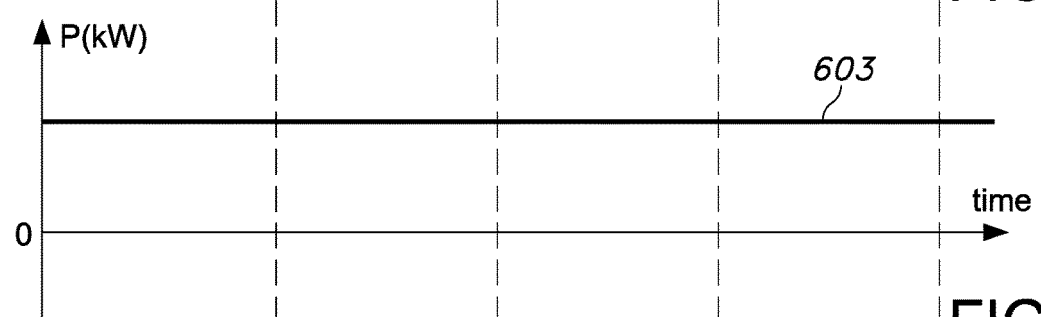
Figure 12C:
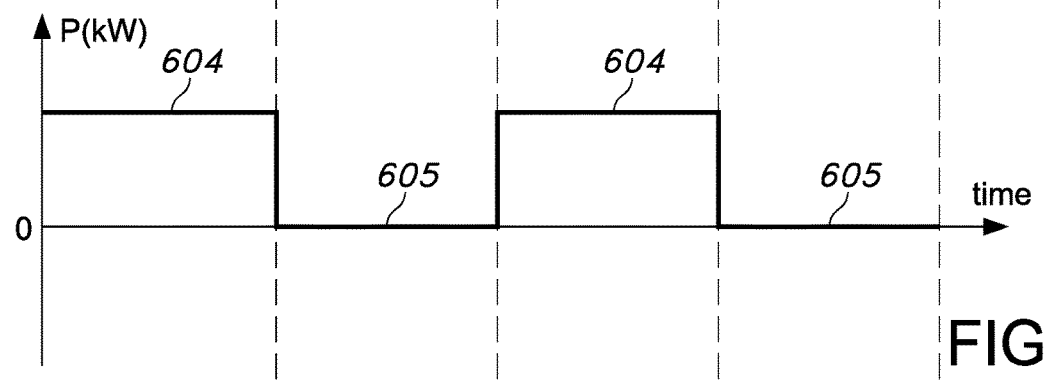
Figure 12D:
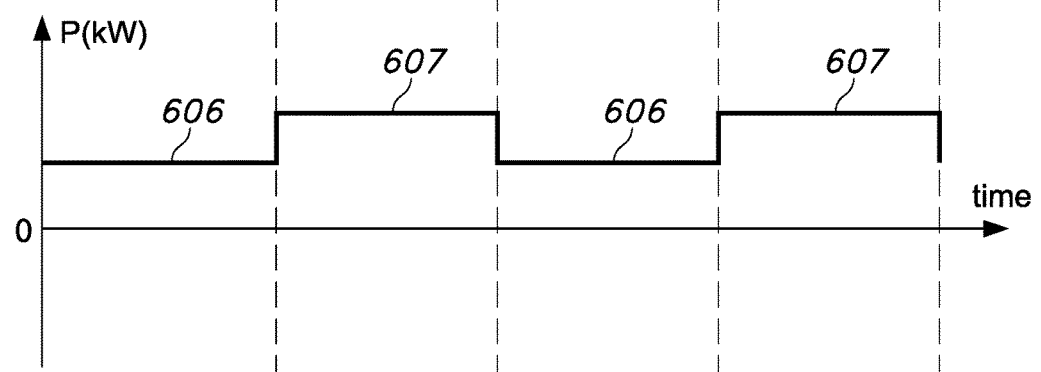

The magnetically and electrically enhanced RF diode I-PVD plasma source 400 can be mounted inside a vacuum chamber 501 to construct the magnetically and electrically enhanced RF diode apparatus 500 shown in FIG. 11. The vacuum chamber 501 contains feed gas and plasma, and is coupled to ground. The vacuum chamber 501 is positioned in fluid communication 502 with a vacuum pump 503, which can evacuate the feed gas from the vacuum chamber 501. Typical baseline pressure in the vacuum chamber 501 is in a range of $10^{-7}$ to $10^{-9}$ Torr.

A feed gas is introduced into the vacuum chamber 501 through a gas inlet 504 from feed gas sources. A mass flow controller 505 controls gas flow to the vacuum chamber 501. In an embodiment, the vacuum chamber 501 has a plurality of gas inlets and mass flow controllers. The gas flow is in a range of 1 to 1000 SCCM depending on plasma operating conditions, pumping speed of a vacuum pump 503, process conditions, and the like. Typical gas pressure in the vacuum chamber 501 during a sputtering process is in a range of 0.1 mTorr to 50 mTorr. In an embodiment, a plurality of gas inlets and a plurality of mass flow controllers sustain a desired gas pressure during the sputtering process. The plurality of gas inlets and plurality of mass flow controllers may be positioned in the vacuum chamber 501 at different locations. The feed gas can be a noble gas, such as Ar, Ne, Kr, Xe; a reactive gas, such as $N_2$, $O_2$; or any other gas that is suitable for sputtering, reactive sputtering processes. The feed gas can also be a mixture of noble and reactive gases. The feed gas can be a gas that contains cathode target material atoms. In embodiment the feed gas can flow though the gas activation source.

The magnetically and electrically enhance RF diode apparatus 500 includes a substrate support 508 that holds a substrate 507 or other work piece for plasma processing. The substrate support 507 is electrically connected to a bias voltage power supply 509. The bias voltage power supply 509 can include a radio frequency (RF) power supply, alternating current (AC) power supply, very high frequency (VHF) power supply, and/or direct current (DC) power supply. The bias power supply 509 can operate in continuous mode or pulsed mode. The bias power supply 509 can be combination of different power supplies that can provide different frequencies. The negative bias voltage on the substrate is in a range of 0 to −1000 V. The negative substrate bias voltage can attract positive ions to the substrate. The substrate support 508 can include a heater 514 that is connected to a temperature controller 521. The temperature controller 521 regulates the temperature of the substrate 507. In an embodiment, the temperature controller 520 controls the temperature of the substrate 507 to be in a range of −20 C to (+400) C.

The cathode target of the magnetically and electrically enhanced RF diode I-PVD plasma source is connected to a RF or pulsed RF power supply 511 through a transmission line 513. The cathode target of the magnetically enhanced RF diode source also can be connected with a DC or pulsed DC power supply 512 through a transmission line 516. The cathode target can be powered with RF and/or with RF and DC power. The cathode target of the magnetically and electrically enhanced RF diode source is connected to ground through a circuit 520 that includes an inductor 517, connection 518, and switch 519.

The pole pieces/electrodes 423 and 422 are connected with power supply 526 through transmission line 527. The substrate holder 508 can be connected to the ground through a circuit 522 and switch 523. The circuit 522 can have inductor 524 and variable resistor 525. This circuit can control the value of constant voltage substrate bias generated by RF power supply 509.

A method of sputtering and resputtering metal films, such as copper includes the following steps. A first step includes sputtering of target material on the surface of the substrate. In an embodiment, the substrate may have at least one via and/or trench. In this step, the feed gas is a noble gas, such as argon. The gas pressure can be in the range of 0.5 mTorr to 50 mTorr. The substrate bias can be between −10 V and −100 V. The magnetically and electrically enhanced RF diode I-PVD plasma source 400 operates in sputtering mode. In this mode, RF power supply 511 applies power 603 to the cathode target 402 and generates negative voltage bias 601 as shown in FIGS. 12 (a, b). In an embodiment, RF power supply 511 operates together with DC power supply 512 and generates power 604 as shown in FIG. 12 (c). The RF power can be in the range of 1 to 10 kW, and the DC power can be in the range of 1 to 40 kW. Switch 519 is open during the sputtering step. The power supply 526 generates voltage on the electrodes 422 and 423. In an embodiment, electrode 423 has a floating potential. In an embodiment, electrodes 423 and 422 have a floating potential. In an embodiment, electrode 423 has a ground potential. Bias power supply generates RF power 606 to form a negative substrate bias as shown in FIG. 12 (d).

FIG. 1 shows an illustrative image of a via 100 after the sputtering step. The via has significant bottom coverage 103, poor side coverage 102, and the top coverage 101 has overhang 104.

Figure 2:
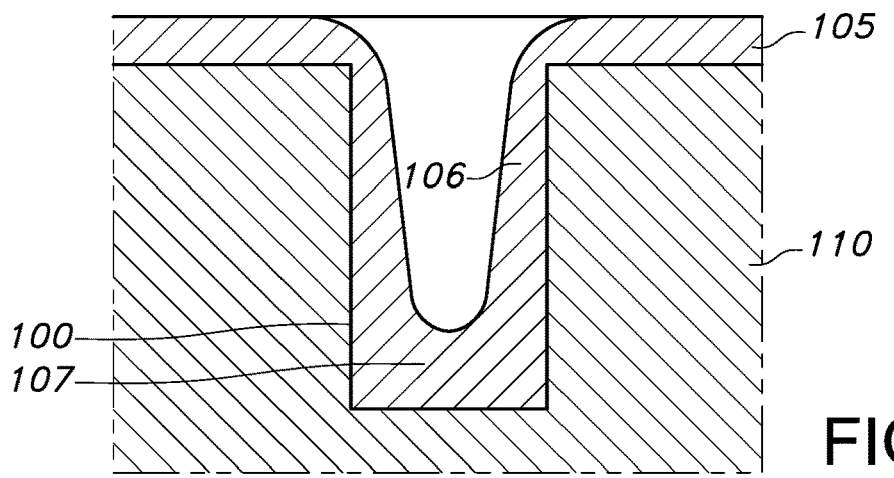
FIG. 2 shows an illustrative cross-sectional image of the via after sputter etching with gas or sputtered target material ions.
Figure 13:
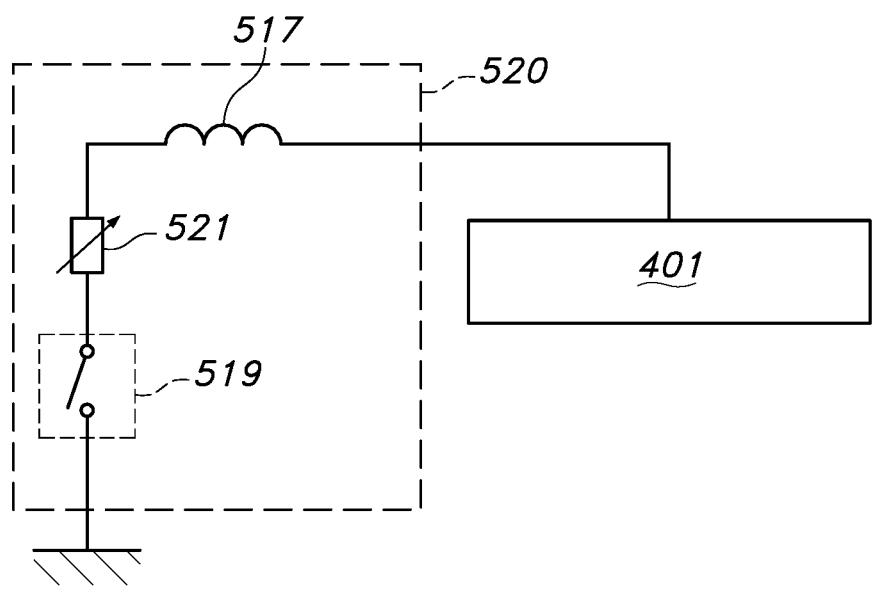
FIG. 13 shows a DC bias circuit that controls a value of the DC bias during RF discharge between the cathode target and an anode of the magnetically and electrically enhanced RF diode plasma source.

A second step is a sputter etching process with argon ions. The magnetically and electrically enhanced RF diode I-PVD plasma source operates in a gas sputter etching mode (resputtering). In this mode, only the RF power supply 511 provides power to the cathode target. The DC power supply 512 is off and switch 515 is open as shown in FIG. 13. In order to eliminate DC bias generated by RF power supply 511, the cathode target is connected to ground through inductor 517 by closing the switch 519. The gas pressure can be in the range of 1 mTorr to 50 mTorr. The RF power supply 509 generates more power 607 in the resputtering mode as shown in FIG. 12 (d). The substrate bias can be between −50 V and −300 V. RF power can be in the range of 5 to 10 kW. RF power applied to the cathode target 402 in sputtering mode and sputter etch mode can be pulsed. The pulse duration can be between 100 µs and 10 ms. FIG. 2 shows an illustrative image of the via after the sputter etching step. The via 100 has reduced bottom coverage 107, improved top coverage 105 and side coverage 106, and the overhang 104 was etched away.

A second sputter etching step can also be performed with argon and copper ions. The magnetically and electrically enhanced RF diode I-PVD plasma source operates in a gas and metal ions sputter etching mode. In this mode, RF power supply 511 and DC 512 power supplies, or just the RF power supply 511, provide power to the cathode target 402. In order to keep DC bias generated by RF power supply 511 and DC power supply 512, the cathode target is disconnected from ground through inductor 517 by opening the switch 519. The gas pressure can be in the range of 1 mTorr to 50 mTorr. The substrate bias can be between −60 V and −200 V. RF power can be in the range of 5 to 10 kW. DC power can be in the range of 1 to 5 kW. By increasing the RF power and reducing argon gas flow, the fraction of copper ions will be increased and the sputter etching process can be performed mainly with copper ions.

The method of sputtering and resputtering metal containing films, such as TiN and TaN include the following steps. A first step includes deposition of target material on the surface of the substrate. In an embodiment, the substrate may have at least one via and/or trench. In this step, the feed gases, such as argon, and reactive gas, such as nitrogen, are introduced in the chamber. The gas pressure can be in the range of 0.5 mTorr to 50 mTorr. The substrate bias can be between −10 V and −60 V. The magnetically and electrically enhanced RF diode plasma source 400 operates in sputtering mode. In this mode, RF power supply 511 generates RF power. In an embodiment, RF power supply 511 operates with DC power supply 514. The RF power can be in the range of 1 to 8 kW and DC power can be in the range of 1 to 15 kW. Switch 519 is open for the sputtering stage. FIG. 1 shows an illustrative image for the via 100 after the sputtering step. The via has significant bottom coverage 103, poor side coverage 102, and the top coverage 101 has overhang 104.

A second sputter etching step can also be performed with argon ions or argon gas ions and tantalum or titanium ions. The magnetically and electrically enhanced RF diode plasma source operates in a gas and metal ions sputter etching mode. In this mode, the RF and DC power supplies, or just the RF power supply, provide power to the cathode target. In order to keep DC bias generated by RF power supply 511 and DC power supply 514, the cathode target is disconnected from ground through inductor 517 by opening the switch 519. The gas pressure can be in the range of 1 mTorr to 50 mTorr. The substrate bias can be between −60 V and −200 V. RF power can be in the range of 5 to 10 kW. DC power can be in the range of 1 to 5 kW. By increasing the RF power and reducing argon gas flow, the fraction of copper ions is increased and the sputter etching process is preferably performed using copper ions.

The circuit 520 can include a variable resistor 521 as shown in FIG. 13. By adjusting the value of the variable resistor 521, the DC cathode target bias can be adjusted to different values.

Figure 3:
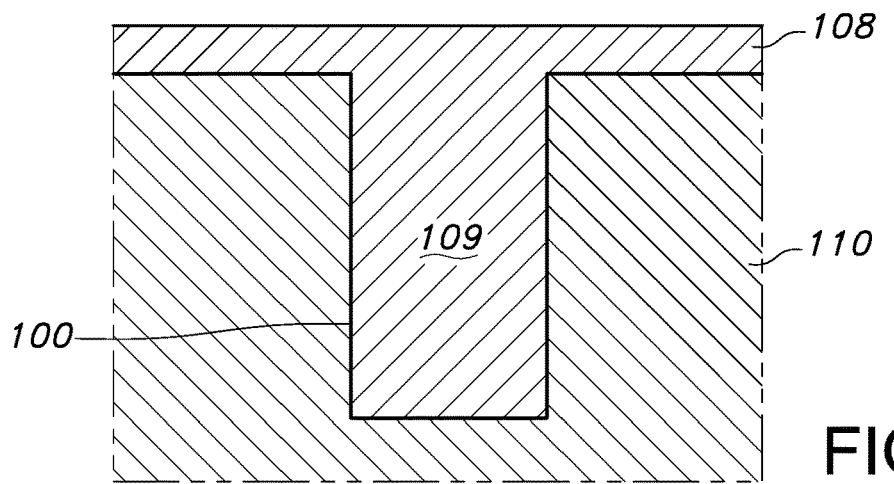
FIG. 3 shows an illustrative cross-sectional image of the via after a series of deposition and sputter etching steps.
Figure 5A:
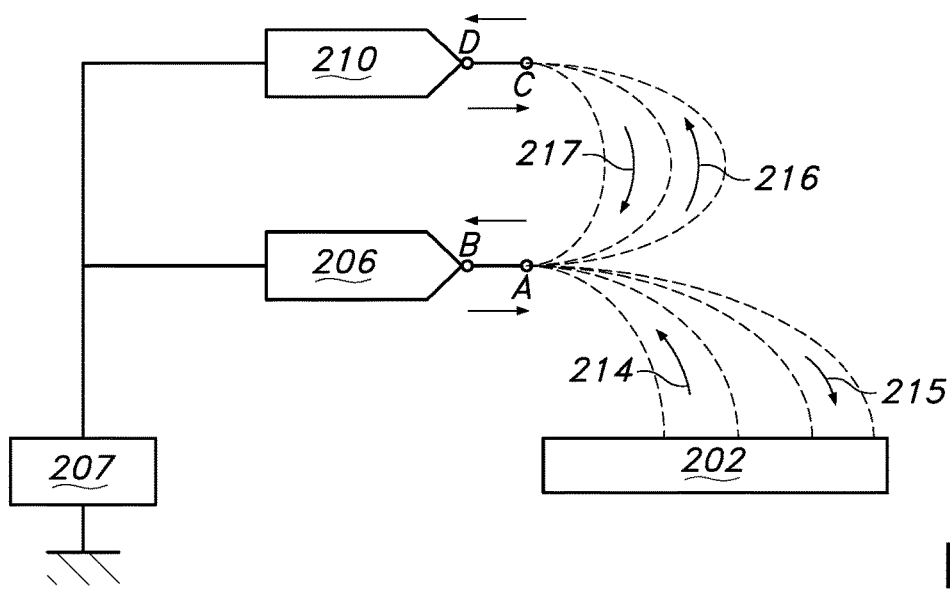
FIG. 5 (a), shows an illustrative cross-sectional view of magnetic field lines for the magnetically and electrically enhanced RF diode plasma source and points of reflection for electrons with two pole pieces or electrodes exposed to the plasma.

Sputtering and sputter etching steps can be repeated until a desired bottom and side coverage is obtained. By using this approach, a via or trench can be completely filled by sputtering target material as shown in FIG. 3.

In some embodiments, the magnetically and electrically enhanced RF diode I-PVD plasma source can be used for the chemically enhanced I-PVD deposition (CE-IPVD) of metal containing film or non-metal films. In this case, the magnetically and electrically enhanced RF diode I-PVD plasma source can operate with the cathode. For example, in order to sputter carbon films with different concentrations of sp3 bonds in the film, the cathode target may be made from carbon material. The feed gas can be a noble gas and carbon atoms containing gas such as $C_2H_2$, $CH_4$ or any other gases. The feed gas may contain $H_2$. During the deposition process, the cathode target can be disconnected from the ground, in which case the switch 519 is opened. Carbon films on the substrate will be formed by carbon atoms from the feed gas and from carbon atoms from the cathode target. During the deposition process, the cathode target can be connected to ground through the circuit 520 when switch 519 is closed. The carbon films on the substrate are formed by carbon atoms from the feed gas. In some embodiments, the feed gas is a mixture of noble gas and gas that contains Cu atoms. In this case, during the deposition, only RF power supply 511 delivers power to the copper cathode target.

The magnetically and electrically enhanced RF diode plasma source can be configured to be a high density plasma chemical vapor deposition (HDP-CVD) source. In this case, only the RF power supply 511 is connected to the cathode assembly 402. The cathode assembly 402 is inductively grounded. Pole pieces/electrodes 422, 423 may have a floating electrical potential or may be connected to the RF power supply. In an embodiment, pole pieces/electrodes 422, 423 are inductively grounded. The RF power supply 511 can generate power in the range of 2-10 kW and RF power supply 526 can generate power in the range 1-5 KW. The feed gas can be any gas that is suitable for a particular CVD process. In an embodiment, pole pieces/electrodes 422, 423 have a floating electrical potential. During a CVD process, the substrate holder 508 can be inductively grounded through the inductor 524, variable resistor 525 and switch 523. In some embodiments, the substrate holder is grounded through inductor 524. During a CVD process, the substrate holder can be inductively grounded 50% of time and ungrounded 50% of time. Inductive grounding eliminates negative voltage bias on the substrate generated by RF discharge, but leaves high frequency RF voltage oscillations. The voltage oscillations promote molecules dissociation and improve deposition rate and quality of the growing film. When substrate holder is not inductively grounded, the negative voltage bias will attract positive ions that will bombard the growing film. This bombardment can damage the growing film. By adjustment of the time ratio for inductive grounding and non-grounding, the film quality can be improved. This approach can be used for any I-PVD, CVD, and/or RIE processes.

The magnetically and electrically enhanced RF diode plasma source can be configured to be a high density plasma gas activation source. This configuration is similar to the CVD configuration. In this case, the feed gas can flow in the magnetically and electrically enhanced RF diode plasma source through the gap 418 inside the anode.

The magnetically and electrically enhanced RF diode I-PVD plasma source can be configured to be a high density plasma reactive ion (HDP-RIE) source. In this case, only the RF power supply 511 is connected to the cathode assembly 401. The cathode assembly 401 is inductively grounded. Pole pieces/electrodes 422, 423 may have a floating electrical potential or may be connected to the RF power supply 526. In some embodiments, pole pieces/electrodes 422, 423 are inductively grounded. The RF power supply 511 can generate power in the range of 2-10 kW and RF power supply 526 can generate power is in the range 1-5 KW if it is connected. Negative RF bias on substrate can be in the range of 50 V and 1000 V. The feed gas can be any gas that is suitable for a particular RIE process.

Figure 14:
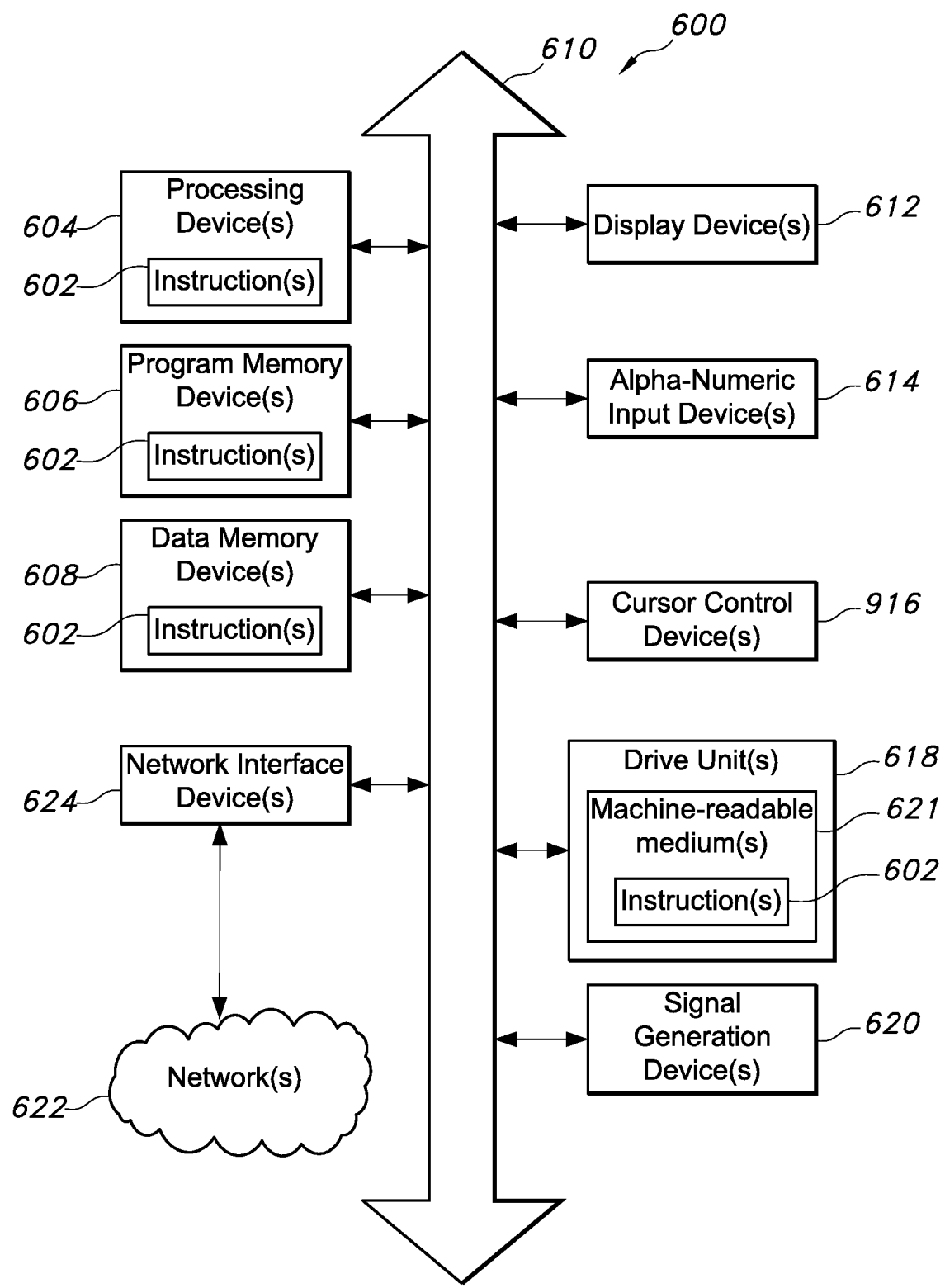
FIG. 14 is a block diagram of at least a portion of an exemplary machine in the form of a computing system that performs methods according to one or more embodiments disclosed herein.

One or more embodiments disclosed herein, or a portion thereof, may make use of software running on a computer or workstation. By way of example, only and without limitation, FIG. 14 is a block diagram of an embodiment of a machine in the form of a computing system 600, within which is a set of instructions 602 that, when executed, cause the machine to perform any one or more of the methodologies according to embodiments of the invention. In one or more embodiments, the machine operates as a standalone device; in one or more other embodiments, the machine is connected (e.g., via a network 622) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 600 includes a processing device(s) 604 (e.g., a central processing unit (CPU), a graphics processing unit (GPU), or both), program memory device(s) 606, and data memory device(s) 608, which communicate with each other via a bus 610. The computing system 600 further includes display device(s) 612 (e.g., liquid crystal display (LCD)), flat panel, solid state display, or cathode ray tube (CRT)). The computing system 600 includes input device(s) 614 (e.g., a keyboard), cursor control device(s) 616 (e.g., a mouse), disk drive unit(s) 618, signal generation device(s) 620 (e.g., a speaker or remote control), and network interface device(s) 624, operatively coupled together, and/or with other functional blocks, via bus 610.

The disk drive unit(s) 618 includes machine-readable medium(s) 626, on which is stored one or more sets of instructions 602 (e.g., software) embodying any one or more of the methodologies or functions herein, including those methods illustrated herein. The instructions 602 may also reside, completely or at least partially, within the program memory device(s) 606, the data memory device(s) 608, and/or the processing device(s) 604 during execution thereof by the computing system 600. The program memory device(s) 606 and the processing device(s) 604 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 612, input device(s) 614, cursor control device(s) 616, signal generation device(s) 620, etc., can be collectively referred to as an "input/output interface," and is intended to include one or more mechanisms for inputting data to the processing device(s) 604, and one or more mechanisms for providing results associated with the processing device(s). Input/output or I/O devices (including but not limited to keyboards (e.g., alpha-numeric input device(s) 614, display device(s) 612, and the like) can be coupled to the system either directly (such as via bus 610) or through intervening input/output controllers (omitted for clarity).

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

An integrated circuit in accordance with the embodiments of the present invention can be employed in essentially any application and/or electronic system in which buffers are utilized. Suitable systems for implementing one or more embodiments of the invention include, but are not limited to, personal computers, interface devices (e.g., interface networks, high-speed memory interfaces (e.g., DDR3, DDR4), etc.), data storage systems (e.g., RAID system), data servers, etc. Systems incorporating such integrated circuits are considered part of embodiments of the invention. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 602, or that which receives and executes instructions 602 from a propagated signal so that a device connected to a network environment 622 can send or receive voice, video or data, and to communicate over the network 622 using the instructions 602. The instructions 602 are further transmitted or received over the network 622 via the network interface device(s) 624. The machine-readable medium also contains a data structure for storing data useful in providing a functional relationship between the data and a machine or computer in an illustrative embodiment of the systems and methods herein.

While the machine-readable medium 602 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiment are not limited to such standards and protocols.

The embodiments described herein are intended to provide a general understanding of the structure of various embodiments, and they are not intended to serve as a complete description of all the elements and features of apparatus and systems that might make use of the structures described herein. Many other embodiments will be apparent to those skilled in the art upon reviewing the above description. Other embodiments are utilized and derived therefrom, such that structural and logical substitutions and changes can be made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A method of ionized physical vapor deposition (I-PVD) sputtering of a layer on a substrate, the method comprising:
    positioning a cathode, an anode, and a cathode magnet assembly in a vacuum chamber;
    providing a gap inside the anode around the cathode, a cusp magnetic field being provided in the gap, at least a portion of magnetic field lines associated with the cusp magnetic field passing through the gap and terminating on the cathode magnet assembly;
    positioning an electrode in the gap;
    providing a noble gas selected to sputter target material;
    applying radio frequency (RF) power to the cathode, thereby generating plasma discharge that ionizes sputtered target material;
    applying voltage to the electrode; and
    applying a negative bias voltage to the substrate, thereby attracting positively charged sputtered material ions to the substrate.

2. The method, as defined by claim 1, wherein a value of the negative bias voltage on the substrate is in a range of about 10 to 100 V.

3. The method, as defined by claim 1, wherein a value of the cusp magnetic field is in a range of about 300 to 10000 G.

4. The method, as defined by claim 1, wherein the feed gas is a mixture of the noble gas and a gas that comprises target material atoms.

5. The method, as defined by claim 1, wherein the feed gas comprises a mixture of the noble gas and a reactive gas.

6. The method, as defined by claim 1, wherein the cathode magnet assembly rotates at a speed in the range of 1 to 100 revolutions per minute.

7. The method, as defined by claim 1, wherein the substrate is a semiconductor wafer with a diameter in a range of 100 mm to 450 mm.

8. The method, as defined by claim 1, wherein a voltage on the electrode is a negative pulsed voltage.

9. An apparatus that ionized physical vapor deposition (I-PVD) sputters a layer on a substrate, the apparatus comprising:
- a cathode, an anode, and a cathode magnet assembly positioned in a vacuum chamber;
- a gap provided inside the anode around the cathode, a cusp magnetic field being provided in the gap, at least a portion of magnetic field lines associated with the cusp magnetic field passing through the gap and terminating on the cathode magnet assembly;
- an electrode positioned in the gap, the electrode providing a voltage;
- a noble feed gas selected to sputter target material;
- a circuit connecting the cathode to radio frequency (RF) power, thereby generating plasma discharge that ionizes sputtered target material; and
- a bias power supply providing negative bias voltage to the substrate, thereby attracting positively charged ions from the sputtered target material to the substrate surface.

10. The apparatus, as defined by claim 9, wherein the electrode comprises a floating electrical potential.

11. The apparatus, as defined by claim 9, wherein the electrode is connected to a power supply.

12. The apparatus, as defined by claim 9, wherein the cathode is connected to a direct current (DC) power supply.

13. The apparatus, as defined by claim 9, wherein a width of the gap is in a range of 1-10 mm.

14. A method of generating high density plasma, the method comprising:
- positioning a cathode, an anode, and a cathode magnet assembly in a vacuum chamber;
- providing a gap inside the anode around the cathode, a cusp magnetic field being provided in the gap, at least a portion of magnetic field lines associated with the cusp magnetic field passing through the gap and terminating on the cathode magnet assembly;
- positioning an electrode in the gap;
- providing a feed gas selected to generate high density plasma;
- applying voltage to the electrode; and
- applying radio frequency (RF) power to the cathode, thereby generating plasma discharge that generates high density plasma.

15. The method, as defined by claim 14, wherein a value of the cusp magnetic field in the gap is in a range of about 300 to 10000 G.

16. The method, as defined by claim 14, wherein the feed gas comprises a mixture of a noble gas and a reactive gas.

17. The method, as defined by claim 14, wherein the cathode magnet assembly rotates at a speed in a range of 1 to 100 revolutions per minute.

18. The method, as defined by claim 14, wherein the substrate is a semiconductor wafer with a diameter in a range of 100 to 450 mm.

19. The method, as defined by claim 14, wherein the voltage on the electrode is a negative pulsed voltage.

20. The method, as defined by claim 14, wherein the cathode is connected to a ground electrical potential through a circuit comprising an inductor.

* * * * *